(12) United States Patent
Nakao et al.

(10) Patent No.: US 8,441,061 B2
(45) Date of Patent: May 14, 2013

(54) NONVOLATILE SEMICONDUCTOR MEMORY DEVICE WITH DIFFERENT DOPING CONCENTRATION WORD LINES

(75) Inventors: Takashi Nakao, Kanagawa-ken (JP); Kazuaki Iwasawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 12/868,450

(22) Filed: Aug. 25, 2010

(65) Prior Publication Data
US 2011/0057249 A1 Mar. 10, 2011

(30) Foreign Application Priority Data
Sep. 10, 2009 (JP) ................................ 2009-208964

(51) Int. Cl.
*H01L 27/115* (2006.01)
(52) U.S. Cl.
USPC ........................................ 257/324; 257/331
(58) Field of Classification Search .................. 257/324, 257/329, 315, 369; 438/197, 586, 589, 591
See application file for complete search history.

(56) References Cited

U.S. PATENT DOCUMENTS

| | | | | |
|---|---|---|---|---|
| 2004/0262651 A1* | 12/2004 | Mouli | ............................ | 257/290 |
| 2005/0173746 A1* | 8/2005 | Dennison | ...................... | 257/296 |
| 2007/0252201 A1* | 11/2007 | Kito et al. | ...................... | 257/331 |
| 2007/0272966 A1* | 11/2007 | Nishida et al. | ................. | 257/314 |
| 2008/0067583 A1 | 3/2008 | Kidoh et al. | | |
| 2008/0173933 A1* | 7/2008 | Fukuzumi et al. | ............. | 257/324 |
| 2009/0108333 A1* | 4/2009 | Kito et al. | ...................... | 257/324 |
| 2010/0078622 A1 | 4/2010 | Yoshimizu et al. | | |

FOREIGN PATENT DOCUMENTS

| | | |
|---|---|---|
| JP | 2003-133436 | 5/2003 |
| JP | 2007-266143 | 10/2007 |
| JP | 2008-72051 | 3/2008 |

* cited by examiner

*Primary Examiner* — Howard Weiss
*Assistant Examiner* — Sue Tang
(74) *Attorney, Agent, or Firm* — Finnegan, Henderson, Farabow, Garrett & Dunner, L.L.P.

(57) ABSTRACT

According to one embodiment, a nonvolatile semiconductor memory device includes a substrate, a stacked structural body, a semiconductor pillar, and a memory unit. The stacked structural body is provided on a major surface of the substrate. The stacked structural body includes electrode films alternately stacked with inter-electrode insulating films in a direction perpendicular to the major surface. The pillar pierces the body in the direction. The memory unit is provided at an intersection between the pillar and the electrode films. The electrode films include at least one of amorphous silicon and polysilicon. The stacked structural body includes first and second regions. A distance from the second region to the substrate is greater than a distance from the first region to the substrate. A concentration of an additive included in the electrode film in the first region is different from that included in the electrode film in the second region.

10 Claims, 13 Drawing Sheets

NONVOLATILE SEMICONDUCTOR MEMORY DEVICE WITH DIFFERENT DOPING CONCENTRATION WORD LINES

CROSS-REFERENCE TO RELATED APPLICATIONS

This application is based upon and claims the benefit of priority from the prior Japanese Patent Application No. 2009-208964, filed on Sep. 10, 2009; the entire contents of which are incorporated herein by reference.

FIELD

Embodiments described herein relate generally to a nonvolatile semiconductor memory device and a method for manufacturing the same.

BACKGROUND

Collectively patterned three-dimensionally stacked memories have been proposed to increase the memory capacity of nonvolatile semiconductor memory devices (memory) (for example, refer to JP-A 2007-266143 (Kokai)). According to such a method, it is possible to form a stacked memory collectively regardless of the number of stacks. Therefore, it is possible to suppress cost increases.

In such a collectively patterned three-dimensionally stacked memory, a stacked structural body including insulating films stacked alternately with electrode films forming word lines is formed; and through-holes are made collectively in the stacked structural body. Then, charge storage layers (memory layers) are provided on the side faces of the through-holes; and semiconductor pillars are provided on the inner sides of the charge storage layers. Thereby, memory cells made of, for example, MONOS (Metal Oxide Nitride Oxide Semiconductor) transistors are formed at the intersections between the semiconductor pillars and each of the electrode films.

In the case where the depth of the through-hole is made deeply with respect to the diameter of the through-hole to increase, for example, the memory capacity in such a collectively patterned three-dimensionally stacked memory, the through-hole may be made with a tapered configuration in which the diameter in the lower portion is smaller than in the upper portion. In the case where the through-hole has a tapered configuration, the threshold voltage of the memory cell is different between the upper portion and the lower portion; and operations become unstable. Moreover, in the case where the diameter in the lower portion is reduced, the semiconductor pillar cannot be filled into the interior; and improvement of the bit density is impeded.

DETAILED DESCRIPTION

Figure 1:
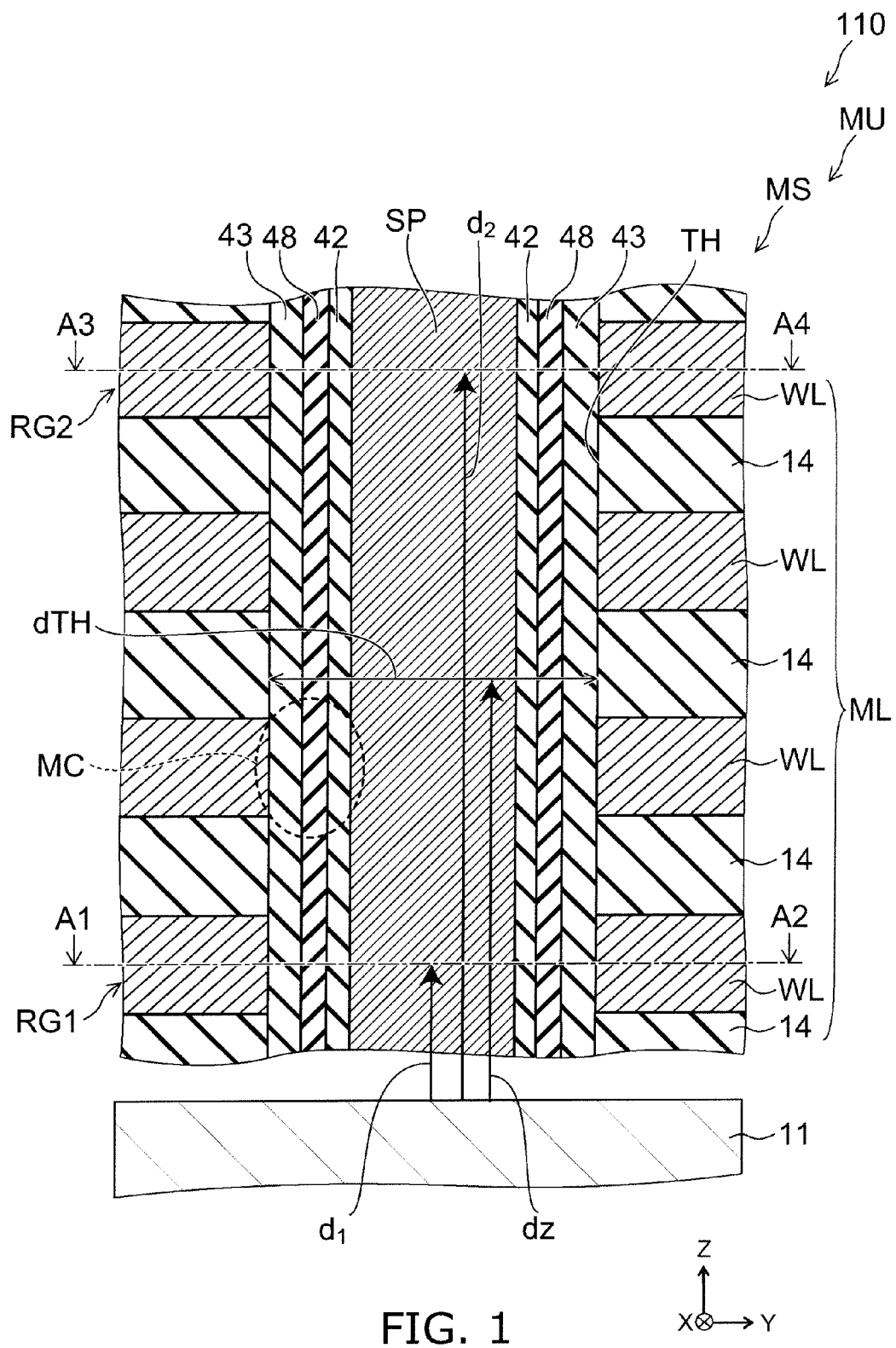
FIG. 1 is a schematic cross-sectional view illustrating the configuration of a nonvolatile semiconductor memory device according to a first embodiment.

In general, according to one embodiment, a nonvolatile semiconductor memory device includes a substrate, a stacked structural body, a semiconductor pillar, and a memory unit. The stacked structural body is provided on a major surface of the substrate. The stacked structural body includes a plurality of electrode films alternately stacked with a plurality of inter-electrode insulating films in a first direction perpendicular to the major surface. The semiconductor pillar pierces the stacked structural body in the first direction. The memory unit is provided at an intersection between the semiconductor pillar and each of the electrode films. The plurality of electrode films include at least one selected from amorphous silicon and polysilicon. The stacked structural body includes a first region and a second region. A distance from the second region to the substrate is greater than a distance from the first region to the substrate. A concentration of an additive included in the electrode film in the first region is different from a concentration of the additive included in the electrode film in the second region.

According to another embodiment, a method for manufacturing a nonvolatile semiconductor memory device is disclosed. The device includes a substrate, a stacked structural body, a semiconductor pillar, and a memory unit. The stacked structural body is provided on a major surface of the substrate. The stacked structural body includes a plurality of electrode films stacked alternately with a plurality of insulating films in a first direction perpendicular to the major surface. The semiconductor pillar pierces the stacked structural body in the first direction. The memory unit is provided at an intersection between the semiconductor pillar and each of the electrode films. The method can form the stacked structural body on the major surface of the substrate. The stacked structural body includes the plurality of electrode films stacked alternately with the plurality of inter-electrode insulating films. In addition, the method can make a through-hole to pierce the stacked structural body in the first direction, form the semiconductor pillar by filling a semiconductor into the through-hole, and form the memory unit at the intersection between the semiconductor pillar and each of the electrode films. The forming of the stacked structural body includes: forming at least one film selected from the electrode film and the inter-electrode insulating film in a first region proximal to the substrate; and forming the at least one film in a second region having a distance to the substrate greater than a distance from the first region to the substrate. An etching rate of the at least one film in the first region is fast in the making of the through-hole. The etching rate of the at least one film in the second region is slower than in the first region.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a nonvolatile semiconductor memory device according to a first embodiment.

Figure 2:
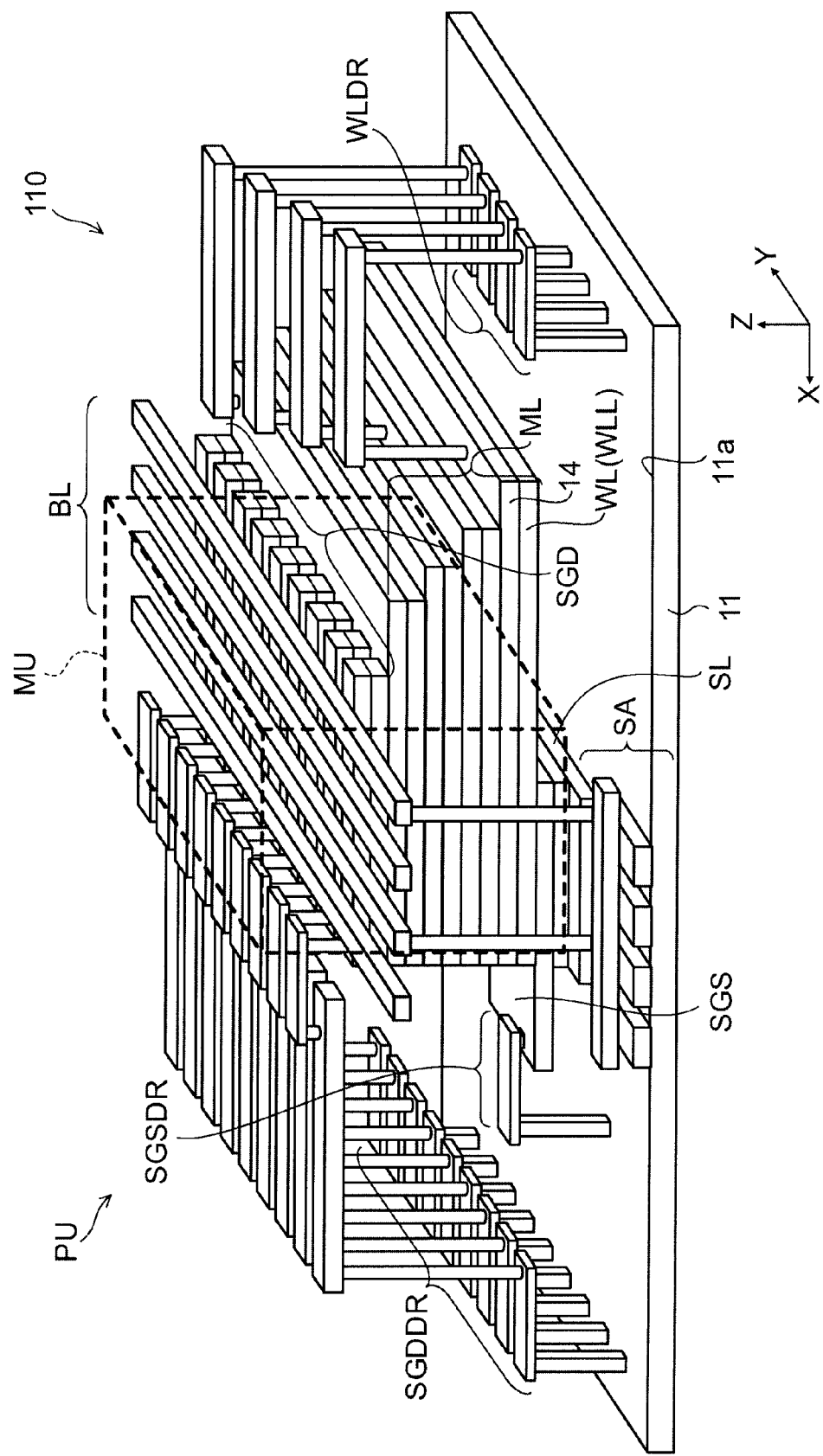
FIG. 2 is a schematic perspective view illustrating the configuration of the nonvolatile semiconductor memory device according to the first embodiment.

FIG. 2 is a schematic perspective view illustrating the configuration of the nonvolatile semiconductor memory device according to the first embodiment.

Figure 3:
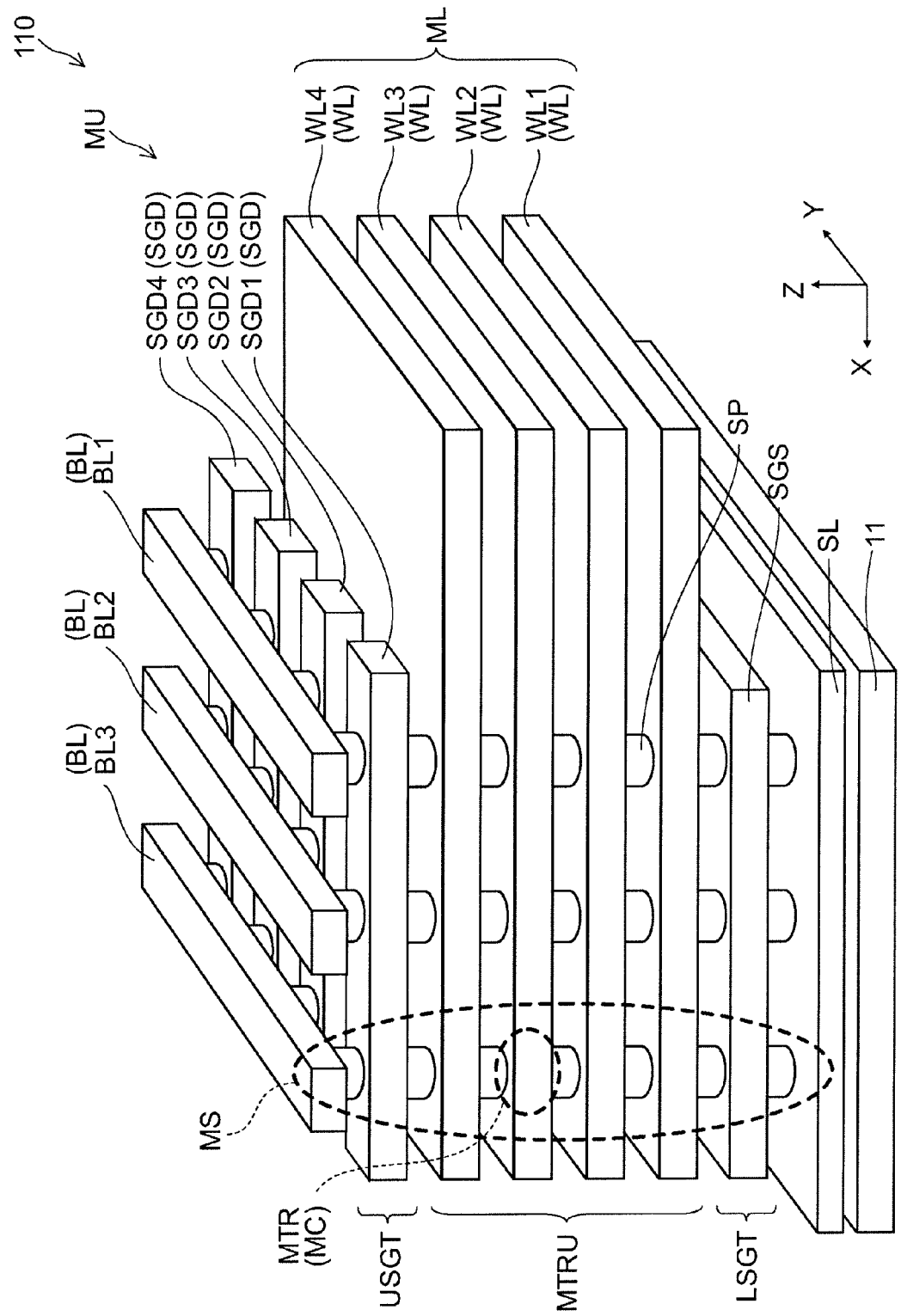
FIG. 3 is a schematic perspective view illustrating the configuration of a memory array unit of the nonvolatile semiconductor memory device according to the first embodiment.

FIG. 3 is a schematic perspective view illustrating the configuration of a memory array unit of the nonvolatile semiconductor memory device according to the first embodiment.

For easier viewing of the drawing in FIG. 3, only the conductive portions are illustrated, and the insulating portions are not illustrated.

A nonvolatile semiconductor memory device 110 according to this embodiment is a collectively patterned three-dimensionally stacked flash memory.

First, an overview of the configuration of the nonvolatile semiconductor memory device 110 will be described referring to FIG. 2 and FIG. 3.

As illustrated in FIG. 2, for example, a memory array unit MU and a peripheral circuit unit PU are provided in the nonvolatile semiconductor memory device 110. The memory array unit MU and the peripheral circuit unit PU are provided, for example, on a major surface 11a of a substrate 11 made of monocrystalline silicon.

Herein, a direction perpendicular to the major surface 11a of the substrate 11 is taken as a Z axis direction (a first direction). One direction in a plane parallel to the major surface 11a is taken as a Y axis direction (a second direction). A direction perpendicular to the Z axis and the Y axis is taken as an X axis direction (a third direction).

A stacked structural body ML is provided in the memory array unit MU. The stacked structural body ML includes multiple electrode films WL stacked alternately with multiple inter-electrode insulating films 14. A semiconductor pillar SP (not illustrated) is provided to pierce the stacked structural body ML in the Z axis direction. The semiconductor pillars SP form multiple memory strings MS (not illustrated) aligned in the Z axis direction. The electrode film WL functions as a word line WLL. Any number of the electrode films WL and the inter-electrode insulating films 14 may be provided in the stacked structural body ML.

Multiple bit lines BL are provided above the stacked structural body ML (on the side opposite to the substrate 11) to align, for example, in the Y axis direction. Each of the memory strings MS is connected to the respective bit line BL. A drain-side selection gate electrode SGD is provided between the stacked structural body ML and the bit line BL. The drain-side selection gate electrode SGD is aligned, for example, in the X axis direction to connect to a drain-side selection gate line drive circuit SGDDR.

A source line SL is provided below the stacked structural body ML (on the substrate 11 side). The source line SL is connected to each of the memory strings MS. A source-side selection gate electrode SGS is provided between the stacked structural body ML and the source line SL. The source-side selection gate electrode SGS is connected to a source-side selection gate line drive circuit SGSDR.

Each of the word lines WLL (the electrode films WL) are connected to a word line drive circuit WLDR. Each of the bit lines BL is connected to, for example, a sense amplifier SA.

The drain-side selection gate line drive circuit SGDDR, the source-side selection gate line drive circuit SGSDR, the word line drive circuit WLDR, and the sense amplifier SA are included in the peripheral circuit unit PU.

As illustrated in FIG. 3, the semiconductor pillar SP is provided to pierce the stacked structural body ML in the Z axis direction. Memory cell transistors MTR (memory cells MC) are provided at portions where the semiconductor pillar SP intersects each of the electrode films WL (e.g., WL1 to WL4). The memory cell transistors MTR are multiply arranged in the Z axis direction to form a memory transistor unit MTRU.

An upper selection gate transistor USGT is provided above the stacked structural body ML at a portion where the drain-side selection gate electrode SGD (e.g., SGD1 to SGD4) intersects the semiconductor pillar SP. On the other hand, a lower selection gate transistor LSGT is provided below the stacked structural body ML at a portion where the source-side selection gate electrode SGS intersects the semiconductor pillar SP.

The upper selection gate transistor USGT, the memory transistor unit MTRU, and the lower selection gate transistor LSGT are included in the memory string MS. Each of the memory strings MS functions as one NAND string.

The upper end of each of the memory strings MS is connected to the bit line BL (e.g., BL1 to BL3). The lower end of each of the memory strings MS is connected to the source line SL.

FIG. 1 illustrates the configuration of a portion of the memory array unit MU, and illustrates, for example, the memory array unit MU when cut in the Y-Z plane.

As illustrated in FIG. 1, the nonvolatile semiconductor memory device 110 includes: the stacked structural body ML provided on the major surface 11a of the substrate 11, where the stacked structural body ML includes the multiple electrode films WL stacked alternately with the multiple inter-electrode insulating films 14 in the Z axis direction; the semiconductor pillar SP piercing the stacked structural body ML in the Z axis direction; a memory layer 48 (a memory unit); an inner insulating film 42; and an outer insulating film 43.

The memory layer 48 is provided between the semiconductor pillar SP and each of the electrode films WL. The inner insulating film 42 is provided between the semiconductor pillar SP and the memory layer 48. The outer insulating film 43 is provided between the memory layer 48 and each of the electrode films WL.

Each of the inner insulating film 42, the memory layer 48, and the outer insulating film 43 has a pipe configuration. The inner insulating film 42, the memory layer 48, and the outer insulating film 43 have, for example, concentric cylindrical configurations centered on a central axis of the semiconductor pillar SP aligned in the Z axis direction and are disposed from the inside toward the outside in the order of the inner insulating film 42, the memory layer 48, and the outer insulating film 43.

For example, the outer insulating film 43, the memory layer 48, and the inner insulating film 42 are formed in this order on the wall face inside a through-hole TH piercing the stacked structural body ML in the Z axis direction; and the semiconductor pillar SP is formed by filling a semiconductor into the remaining space.

The through-hole TH has, for example, a circular configuration (including, in addition to precise circular configurations, configurations such as ellipses, flattened circles, etc.) when cut in the X-Y plane. Accordingly, in the memory cell MC, the curvature of the inner insulating film 42 is greater than the curvature of the outer insulating film 43.

Although the case is illustrated in this specific example where the semiconductor pillar SP has a columnar configuration without voids or other members included in the interior thereof, the semiconductor pillar SP may have a pipe configuration aligned in the Z axis direction. In the case where the semiconductor pillar SP has a pipe configuration, a core member portion made of an insulator may be provided inside the pipe configuration thereof; or the interior of the pipe configuration may be a void. For example, a seam portion may exist at the central portion of the semiconductor pillar SP when the outer insulating film 43, the memory layer 48, the inner insulating film 42, and the semiconductor pillar SP are formed in this order on the inner wall face of the through-hole TH. Hereinbelow, the case is described where the semiconductor pillar SP has a columnar configuration.

The memory cells MC are provided at the intersections between the semiconductor pillars SP and the electrode films WL of the stacked structural body ML. In other words, the memory cell transistors MTR of the memory layers 48 are provided in a three-dimensional matrix configuration at portions where the semiconductor pillars SP intersect the electrode films WL; and by storing charge in the memory layers 48, each of the memory cell transistors MTR functions as the memory cell MC to store data.

The inner insulating film 42 functions as a tunneling insulating film of the memory cell transistor MTR of the memory cell MC. On the other hand, the outer insulating film 43 functions as a blocking insulating film of the memory cell transistor MTR of the memory cell MC. The inter-electrode insulating film 14 functions as an inter-layer insulating film insulating the electrode films WL from each other.

Amorphous silicon or polysilicon provided with conductivity, for example, may be used as the electrode film WL. Further, the electrode film WL may include a metal, an alloy, etc. In this specific example, amorphous silicon or polysilicon is used as the electrode film WL.

For example, silicon oxide films may be used as the inter-electrode insulating film 14, the inner insulating film 42, and the outer insulating film 43. The inter-electrode insulating film 14, the inner insulating film 42, and the outer insulating film 43 may be single-layer films or stacked films.

A silicon nitride film, for example, may be used as the memory layer 48; and the silicon nitride film functions as the portion storing information by storing or emitting a charge due to an electric field applied between the semiconductor pillar SP and the electrode film WL. The memory layer 48 may be a single-layer film or a stacked film.

The materials of the inter-electrode insulating film 14, the inner insulating film 42, the memory layer 48, and the outer insulating film 43 are not limited to the materials recited above; and any insulative material may be used.

The stacked structural body ML includes a first region RG1 and a second region RG2. The second region RG2 is a region having a distance to the substrate 11 greater than the distance from the first region RG1 to the substrate 11.

In the nonvolatile semiconductor memory device 110, the concentration of the additive included in the electrode film WL in the first region RG1 having a proximal distance d1 to the substrate 11 is different from the concentration of the additive included in the electrode film WL in the second region RG2 having a distal distance d2 to the substrate 11 greater than the distance from the first region RG1 to the substrate 11.

In other words, the etching rate of the electrode film WL is controlled in the depth direction to make the through-hole TH with a perpendicular wall face by providing different additive concentrations in the first region RG1 and the second region RG2. In other words, the diameter of the through-hole TH in the first region RG1 (i.e., the outer diameter of the outer insulating film 43 when the outer insulating film 43 is cut along line A1-A2) can be substantially equal to the diameter of the through-hole TH in the second region RG2 (i.e., the outer diameter of the outer insulating film 43 when the outer insulating film 43 is cut along line A3-A4).

Thereby, the threshold voltage of the memory cell MC in the first region RG1 can be substantially equal to the threshold voltage of the memory cell MC in the second region RG2.

Hereinbelow, the portion of the first region RG1 is referred to as "lower portion" as appropriate; and the portion of the second region RG2 is referred to as "upper portion" as appropriate.

For example, an amorphous silicon film doped with P (phosphorus) and Ge (germanium) is used as the electrode film WL. The stacked structural body ML is formed by stacking such electrode films WL alternately with the inter-electrode insulating films 14. In such a case, the concentration of Ge is changed in the stacking direction (the Z axis direction).

FIGS. 4A to 4E are graphs illustrating characteristics of the nonvolatile semiconductor memory device according to the first embodiment.

Figure 4A:
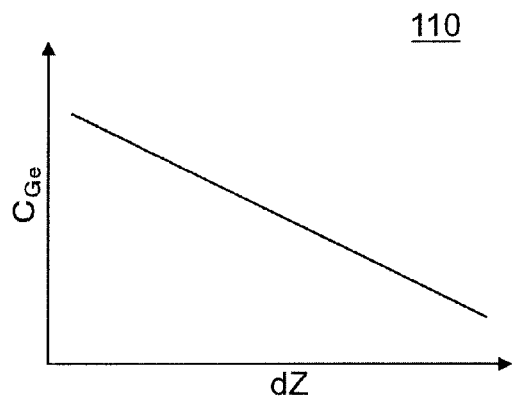
FIGS. 4A to 4E are graphs illustrating characteristics of the nonvolatile semiconductor memory device according to the first embodiment.

Namely, FIG. 4A illustrates the relationship between the concentration of Ge included in the electrode film WL and a distance dZ from the substrate 11. The distance dZ from the substrate 11 is plotted on the horizontal axis; and a concentration $C_{Ge}$ of Ge is plotted on the vertical axis.

Figure 4B:
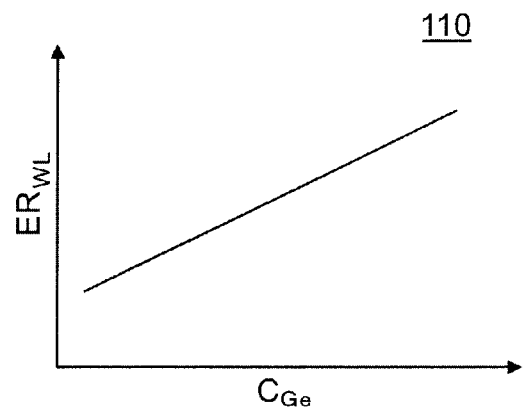

FIG. 4B illustrates the relationship between the concentration of Ge and an etching rate $ER_{WL}$ of the electrode film WL. The concentration $C_{Ge}$ of Ge is plotted on the horizontal axis; and the etching rate $ER_{WL}$ is plotted on the vertical axis.

Figure 4C:
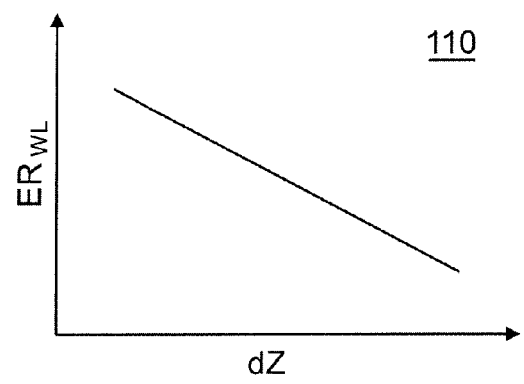

FIG. 4C illustrates the relationship between the etching rate $ER_{WL}$ of the electrode film WL and the distance dZ from the substrate 11. The distance dZ from the substrate 11 is plotted on the horizontal axis; and the etching rate $ER_{WL}$ of the electrode film WL is plotted on the vertical axis.

Figure 4D:
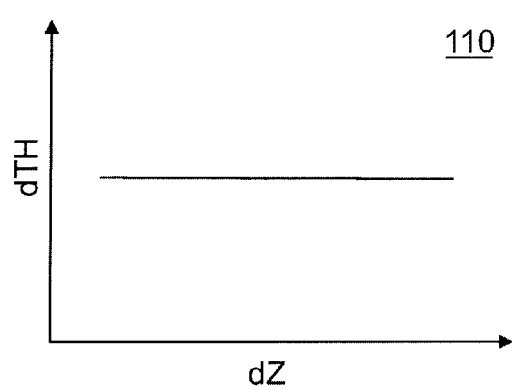

FIG. 4D illustrates the relationship between the diameter dTH of the through-hole TH and the distance dZ from the substrate 11. The distance dZ from the substrate 11 is plotted on the horizontal axis; and the diameter dTH of the through-hole TH is plotted on the vertical axis. Here, the diameter dTH of the through-hole TH is, for example, the diameter of the through-hole TH at the electrode film WL portion.

Figure 4E:
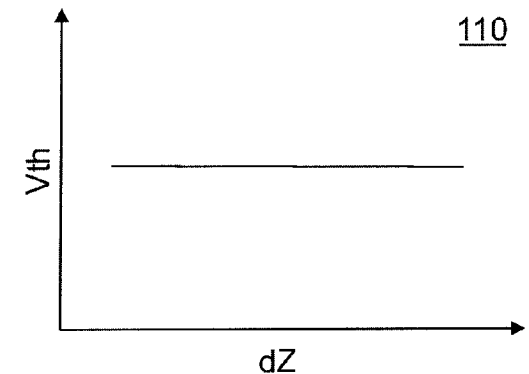

FIG. 4E illustrates the relationship between a threshold voltage Vth of the memory cell MC and the distance dZ from the substrate 11. The distance dZ from the substrate 11 is plotted on the horizontal axis; and the threshold voltage Vth of the memory cell MC is plotted on the vertical axis.

As illustrated in FIG. 4A, in this specific example, the concentration $C_{Ge}$ of Ge decreases as the distance dZ from the substrate 11 increases. The concentration of P of the electrode film WL may be, for example, constant regardless of the distance dZ from the substrate 11.

The etching rate of the electrode film WL is changed by changing the concentration $C_{Ge}$ of Ge, i.e., the additive of the electrode film WL.

In other words, as illustrated in FIG. 4B, the etching rate $ER_{WL}$ of the electrode film WL increases as the concentration $C_{Ge}$ of Ge increases. Restated, in the case where Ge is used as the additive, the concentration $C_{Ge}$ of Ge has a positive correlation with the etching rate $ER_{WL}$ of the electrode film WL.

Accordingly, as illustrated in FIG. 4C, the etching rate $ER_{WL}$ of the electrode film WL decreases as the distance dZ from the substrate 11 increases. In other words, the etching rate $ER_{WL}$ is high in the first region RG1 in the lower portion of the through-hole TH; and the etching rate $ER_{WL}$ in the second region RG2 in the upper portion of the through-hole TH is relatively lower than in the first region RG1.

As a result, as illustrated in FIG. 4D, the diameter dTH of the through-hole TH is constant regardless of the distance dZ from the substrate 11. In other words, as illustrated in FIG. 1, the diameter dTH of the through-hole TH in the first region RG1 in the lower portion is substantially equal to the diameter dTH of the through-hole TH in the second region RG2 in the upper portion.

Thereby, as illustrated in FIG. 4E, the threshold voltage Vth of the memory cell MC is constant regardless of the distance dZ from the substrate 11. In other words, the threshold voltage Vth of the memory cell MC in the first region RG1 in the lower portion is substantially equal to the threshold voltage Vth of the memory cell MC in the second region RG2 in the upper portion.

Thus, according to the nonvolatile semiconductor memory device 110 according to this embodiment, the through-hole TH can be made with a perpendicular wall having the same diameter between the upper portion and the lower portion; uniform threshold voltage characteristics between the upper portion and the lower portion are possible; and a nonvolatile semiconductor memory device having stable operations can be provided.

In the memory cell MC, for example, a difference between the electric field applied to the inner insulating film 42 and the electric field applied to the outer insulating film 43 can be provided by the difference between the curvatures of the inner insulating film 42 and the outer insulating film 43. Thereby, the change of the threshold voltage Vth of the memory cell MC can be used to store information based on performing the operations of storing charge into and emitting charge from the memory layer 48. In such a case, fluctuation of the diameter of the through-hole TH between the multiple memory cells MC arranged in the Z axis direction may cause the difference between the electric field applied to the inner insulating film 42 and the electric field applied to the outer insulating film 43 to fluctuate. As a result, the threshold voltage Vth of the memory cell MC fluctuates.

At this time, in the nonvolatile semiconductor memory device 110, the through-hole TH is made with a perpendicular wall. Therefore, the threshold voltage characteristics can be uniform between the upper portion and the lower portion; and stable operations can be realized.

FIGS. 5A to 5D are schematic cross-sectional views in order of the processes, illustrating a method for manufacturing the nonvolatile semiconductor memory device according to the first embodiment.

Figures 5A, 5B:
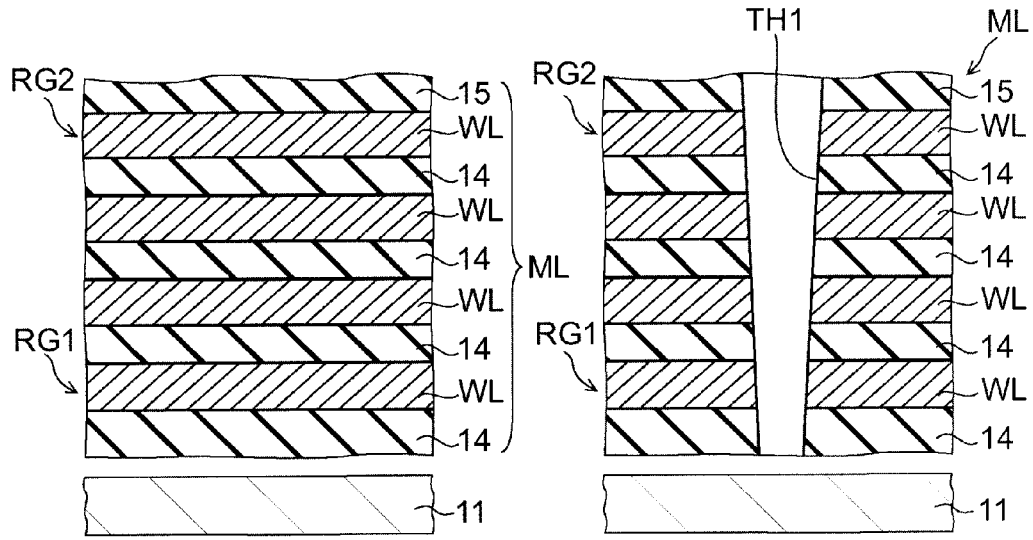
FIGS. 5A to 5D are schematic cross-sectional views in order of the processes, illustrating a method for manufacturing the nonvolatile semiconductor memory device according to the first embodiment.

As illustrated in FIG. 5A, the stacked structural body ML is formed on the substrate 11 by stacking the electrode films WL alternately with the inter-electrode insulating films 14. Although an inter-layer insulating film 15 is provided on the electrode film WL most distal to the substrate 11, the inter-layer insulating film 15 also is included in the stacked structural body ML. The inter-layer insulating film 15 may be taken to be the inter-electrode insulating film 14. Although four of each of the electrode films WL and the inter-electrode insulating films 14 are illustrated in FIGS. 5A to 5D, any number of such films may be used. For example, the number of each of the electrode films WL and the inter-electrode insulating films 14 may be ten, that is, a total of twenty films of the electrode films WL and the inter-electrode insulating films 14 may be stacked.

In the first region RG1 proximal to the substrate 11, the concentration $C_{Ge}$ of Ge is, for example, 20%; and the concentration $C_{Ge}$ of Ge in the second region RG2 distal to the substrate 11 is 0%. Between the first region RG1 and the second region RG2, the concentration $C_{Ge}$ of Ge has values between 0% and 20% and is set to decrease from the first region RG1 toward the second region RG2.

As illustrated in FIG. 5B, a hard mask layer is provided on the stacked structural body ML; and a hole TH1 forming the through-hole TH is made by lithography and RIE (Reactive Ion Etching).

At this time, the diameter in the lower portion (the first region RG1) of the hole TH1 is smaller than the diameter in the upper portion (the second region RG2); and the hole TH1 has a tapered configuration.

Figures 5C, 5D:
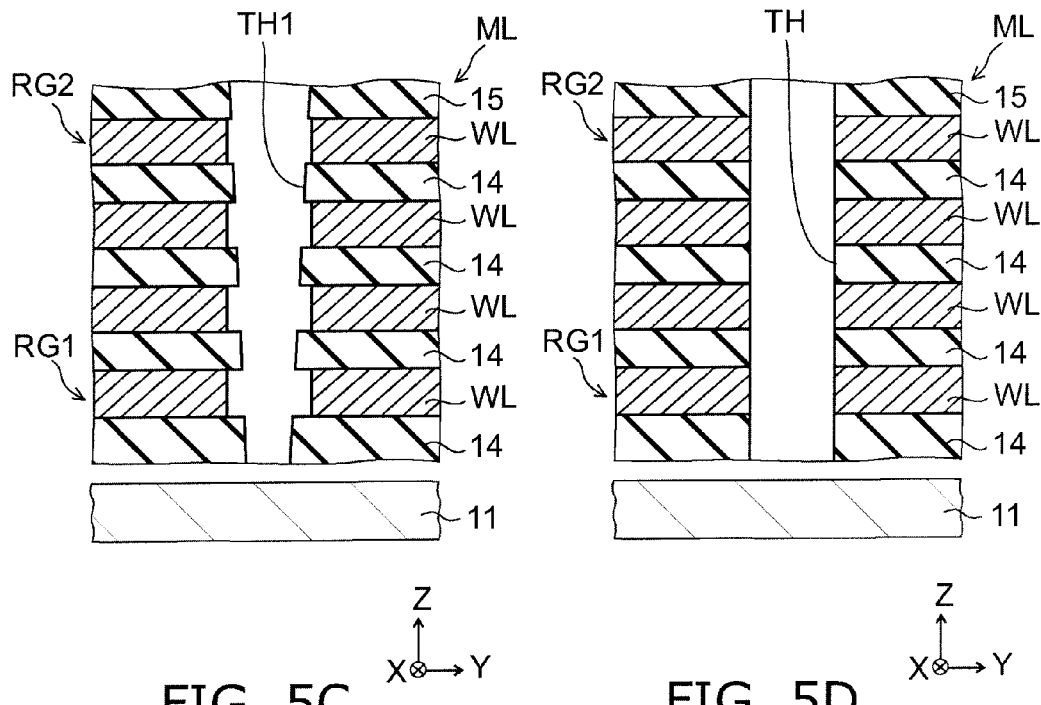

At this time, as illustrated in FIG. 5C, the electrode films WL are selectively etched isotropically. In other words, processing is performed using, for example, a mixed liquid of aqueous $NH_3 + H_2O_2$. In such etching as illustrated in FIG. 4B, the etching rate $ER_{WL}$ is fast in the lower portion (the first region RG1) having the high concentration $C_{Ge}$ of Ge; and the etching rate $ER_{WL}$ is slow in the upper portion (the second region RG2) having the low concentration $C_{Ge}$ of Ge. Therefore, as illustrated in FIG. 5C, the spacing (the diameter of the hole TH1) between the electrode films WL in the first region RG1 enlarges relatively more than in the second region RG2. In other words, the portions of the hole TH1 made in the tapered configuration opposing the electrode films WL are etched; and the etching amount in the lower portion (the first region RG1) is greater than in the upper portion (the second region RG2). Thereby, the spacing between the electrode films WL can be substantially the same between the lower portion and the upper portion.

Because the electrode films WL are recessed by the etching, the inter-electrode insulating films 14 protrude from the electrode films WL inside the hole TH1.

Then, as illustrated in FIG. 5D, the inter-electrode insulating films 14 (and the inter-layer insulating film 15) protruding inside the hole TH1 are pulled back as necessary by processing using diluted hydrofluoric acid or buffered hydrofluoric acid; and the protruding portions are removed. Thereby, the through-hole TH is completed. The through-hole TH has substantially the same diameter between the first region RG1 and the second region RG2; and the wall face of the through-hole TH is substantially perpendicular with respect to the Z axis.

Subsequently, a silicon oxide film forming the outer insulating film 43, a silicon nitride film forming the memory layer 48, a silicon oxide film forming the inner insulating film 42, and amorphous silicon, for example, forming the semiconductor pillar SP are formed in the interior of the through-hole TH; the various inter-layer insulating films, selection gate electrodes SG, the various interconnects, etc., are formed; and the nonvolatile semiconductor memory device 110 illustrated in FIG. 1 to FIG. 3 can be formed.

Any method capable of etching the electrode films WL in the lateral direction (the direction parallel to the substrate 11) and in which the etching rate $ER_{WL}$ of the electrode film WL depends on the concentration $C_{Ge}$ of Ge may be employed for the etching of the electrode film WL illustrated in FIG. 5C. For example, alkaline hydrogen peroxide treatment using a cholinergic solution or hot phosphoric acid treatment also may be applied. Not only such wet processing but also dry processing such as RIE may be used if etching is possible in the lateral direction and the etching rate $ER_{WL}$ is dependent on the Ge concentration.

Thus, according to the nonvolatile semiconductor memory device 110, a through-hole having a perpendicular wall can be made; uniform threshold voltage characteristics are possible between the upper portion and the lower portion; and stable operations can be realized.

The removal of the protruding portions of the inter-electrode insulating films 14 protruding inside the hole TH1 as described in regard to FIG. 5D may be omitted. However, by removing such protruding portions, the portions inside the through-hole TH having small diameters can be removed. Therefore, the film formation of the outer insulating film 43, the memory layer 48, the inner insulating film 42, and the semiconductor pillar SP is easier. Therefore, it is desirable to remove such protruding portions.

In the nonvolatile semiconductor memory device 110, P and Ge are the additives added to the electrode film WL; and of these additives, the concentration of Ge is changed between the first region RG1 and the second region RG2, and the concentration of P is uniform. Because the electrical resistance of the electrode film WL changes with the concentration of P, changing the concentration of P may cause greater changes of the resistance of the electrode film WL; and other constraints on the driving conditions and the like may occur. On the other hand, the electrical resistance of the electrode film WL does not change substantially with the concentration of Ge. Therefore, it is more advantageous to change the concentration of Ge while keeping the concentration of P constant because such constraints do not occur.

B (boron) and Ge, for example, may be used as the additive added to the electrode film WL. In such a case as well, by changing the concentration of Ge while keeping the concentration of B constant, constraints of the fluctuation of the electrical resistance do not occur; the etching rate $ER_{WL}$ of the electrode film WL can be controlled; and it is more advantageous.

Thus, the additive may include a Group 14 element (e.g., Ge) and one selected from a Group 13 element (e.g., B and the like) and a Group 15 element (e.g., P, As, Sb, and the like). In such a case, it is more desirable for the concentration of the Group 14 element included in the electrode film WL in the first region RG1 to be set to be different from the concentration of the Group 14 element included in the electrode film WL in the second region RG2.

Also in the case where P is used as the additive of the electrode film WL, the relationship between the concentration of P and the etching rate $ER_{WL}$ of the electrode film WL is similar to the relationship illustrated in FIG. 4B. In other words, the etching rate of the electrode film WL increases as the concentration of P included in the electrode film WL increases. In other words, in the case where P is used as the additive as well, the concentration of P has a positive correlation with the etching rate of the electrode film WL.

Therefore, in the case where P is added to the electrode film WL without adding Ge and the concentration of P is changed, it is desirable for the concentration of P included in the electrode film WL in the first region RG1 to be set higher than the concentration of P included in the electrode film WL in the second region RG2. Thereby, the etching rate of the electrode film WL in the first region RG1 can be higher than in the second region RG2; and the diameter of the through-hole TH can be uniform. Thus, in the case where the concentration of P is changed, the concentration of P may be set as described above so that the fluctuation of the electrical resistance of the electrode film WL due to the concentration of P is within a prescribed range.

Thus, in the case where the additive has a positive correlation between the added concentration and the etching rate of the electrode film WL, that is, in the case where, for example, the additive includes at least one selected from germanium and phosphorus, the concentration of the additive included in the electrode film WL in the first region RG1 is set higher than the concentration of the additive included in the electrode film WL in the second region RG2.

In the nonvolatile semiconductor memory device 110 recited above, the concentration $C_{Ge}$ of Ge included in the electrode film WL is changed between the first region RG1 and the second region RG2. Thereby, the etching rate $ER_{WL}$ is changed between the first region RG1 and the second region RG2; and the diameter of the through-hole TH is substantially the same between the first region RG1 and the second region RG2. However, in the case where an additive other than Ge is added to the electrode film WL, the diameter of the through-hole TH can be substantially the same between the first region RG1 and the second region RG2 by employing an etching method of the electrode film WL having a correlation with the concentration of the additive.

One other nonvolatile semiconductor memory device 110a (not illustrated) according to this embodiment will now be described.

In the nonvolatile semiconductor memory device 110a, an amorphous silicon film doped with B is used as the electrode film WL. The stacked structural body ML is formed in which such electrode films WL are stacked alternately with the inter-electrode insulating films 14. In such a case, the concentration of B is changed in the stacking direction (the Z axis direction).

FIGS. 6A to 6E are graphs illustrating characteristics of the one other nonvolatile semiconductor memory device according to the first embodiment.

Figure 6A:
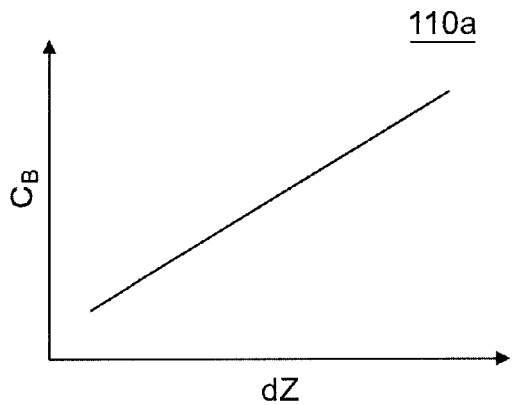
FIGS. 6A to 6E are graphs illustrating characteristics of one other nonvolatile semiconductor memory device according to the first embodiment.

Namely, FIG. 6A illustrates the relationship between the concentration of B included in the electrode film WL of the nonvolatile semiconductor memory device 110a and the distance dZ from the substrate 11. The distance dZ from the substrate 11 is plotted on the horizontal axis; and a concentration $C_B$ of B is plotted on the vertical axis.

Figure 6B:
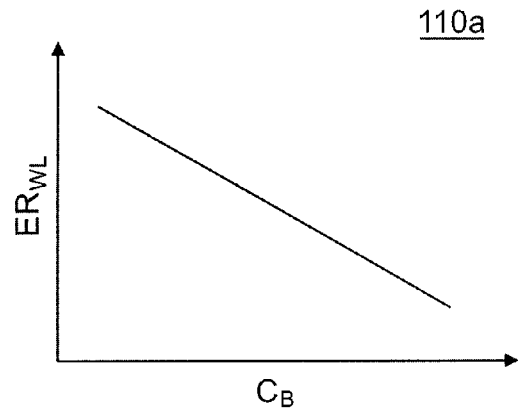

FIG. 6B illustrates the relationship between the concentration of B and the etching rate $ER_{WL}$ of the electrode film WL. The concentration $C_B$ of B is plotted on the horizontal axis; and the etching rate $ER_{WL}$ is plotted on the vertical axis.

Figure 6C:
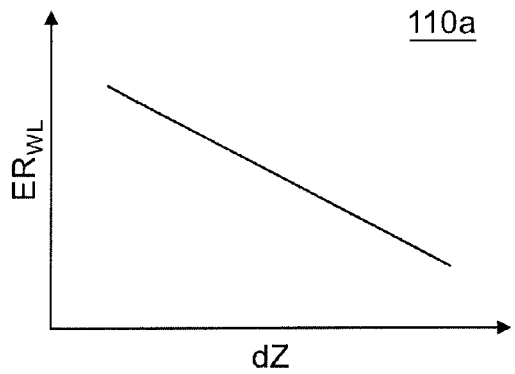

FIG. 6C illustrates the relationship between the etching rate $ER_{WL}$ of the electrode film WL and the distance dZ from the substrate 11.

Figure 6D:
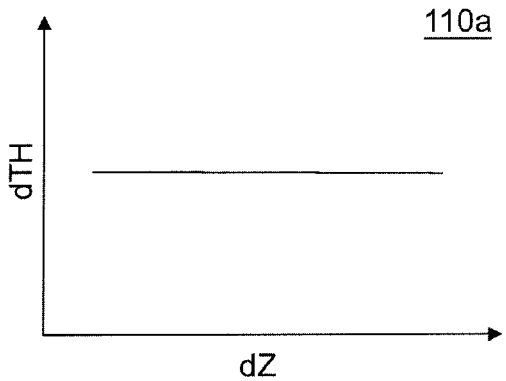

FIG. 6D illustrates the relationship between the diameter dTH of the through-hole TH and the distance dZ from the substrate 11.

Figure 6E:
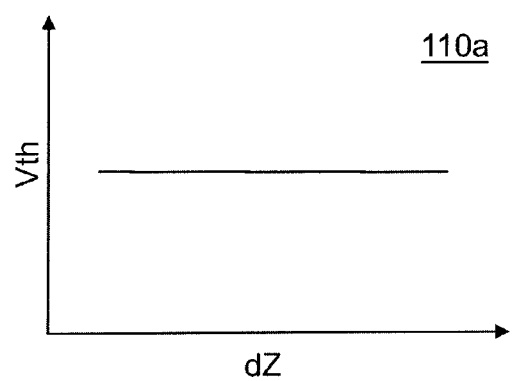

FIG. 6E illustrates the relationship between the threshold voltage Vth of the memory cell MC and the distance dZ from the substrate 11.

In this specific example as illustrated in FIG. 6A, the concentration $C_B$ of B is increased as the distance dZ from the substrate 11 increases.

As illustrated in FIG. 6B, the etching rate $ER_{WL}$ of the electrode film WL decreases as the concentration $C_B$ of B increases. In other words, in the case where B is used as the additive, the concentration $C_B$ of B has a negative correlation with the etching rate $ER_{WL}$ of the electrode film WL.

Accordingly, as illustrated in FIG. 6C, the etching rate $ER_{WL}$ of the electrode film WL decreases as the distance dZ from the substrate 11 increases. In other words, the etching rate $ER_{WL}$ is high in the first region RG1 in the lower portion of the through-hole TH; and the etching rate $ER_{WL}$ in the second region RG2 in the upper portion of the through-hole TH is relatively lower than in the first region RG1.

As a result, as illustrated in FIG. 6D, the diameter dTH of the through-hole TH is constant regardless of the distance dZ from the substrate 11.

Thereby, as illustrated in FIG. 6E, the threshold voltage Vth of the memory cell MC is constant regardless of the distance dZ from the substrate 11.

Thus, according to the nonvolatile semiconductor memory device 110a according to this embodiment, a through-hole having a perpendicular wall can be made; uniform threshold voltage characteristics are possible between the upper portion and the lower portion; and stable operations can be realized.

Thus, in the nonvolatile semiconductor memory device 110a of this specific example as well, the diameter of the through-hole TH can be uniform by controlling the etching rate $ER_{WL}$ of the electrode film WL by controlling the concentration of the additive added to the electrode film WL.

In the case where an additive having a negative correlation between the added concentration and the etching rate of the electrode film WL is used, that is, in the case where the additive includes, for example, B, the concentration of the additive included in the electrode film WL in the first region RG1 is set lower than the concentration of the additive included in the electrode film WL in the second region RG2.

Second Embodiment

In a nonvolatile semiconductor memory device 112 (not illustrated) according to a second embodiment of the invention, the configurations of the electrode film WL and the inter-electrode insulating film 14 differ from those of the nonvolatile semiconductor memory device 110. Otherwise, the nonvolatile semiconductor memory device 112 is similar to the nonvolatile semiconductor memory device 110. The configurations of the electrode film WL and the inter-electrode insulating film 14 of the nonvolatile semiconductor memory device 112 will now be described.

In the nonvolatile semiconductor memory device 112, the additive included in the electrode film WL is P; and the concentration of P is constant. In other words, the etching rate $ER_{WL}$ of the electrode film WL is the same in the Z axis direction, that is, between the first region RG1 and the second region RG2. Also, the etching rate of the inter-electrode insulating film 14 may be changed in the Z axis direction, that is, between the first region RG1 and the second region RG2. For example, the film formation temperature in the forming of the inter-electrode insulating film 14 may be changed in the Z axis direction. Thereby, the etching rate $ER_{WL}$ of the inter-electrode insulating film 14 can be changed.

FIGS. 7A to 7E are graphs illustrating characteristics of the nonvolatile semiconductor memory device according to the second embodiment.

Figure 7A:
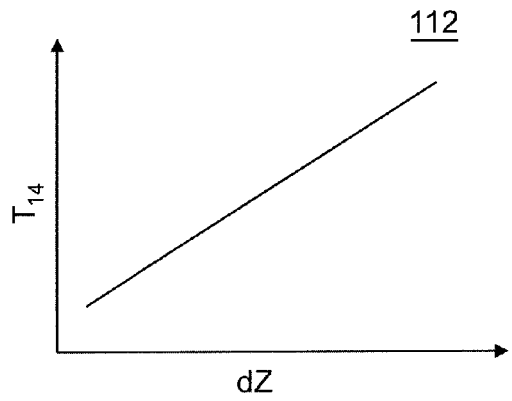
FIGS. 7A to 7E are graphs illustrating characteristics of a nonvolatile semiconductor memory device according to a second embodiment.

Namely, FIG. 7A illustrates the relationship between a film formation temperature $T_{14}$ of the inter-electrode insulating film 14 of the nonvolatile semiconductor memory device 112 and the distance dZ from the substrate 11. The distance dZ from the substrate 11 is plotted on the horizontal axis; and the film formation temperature $T_{14}$ is plotted on the vertical axis.

Figure 7B:
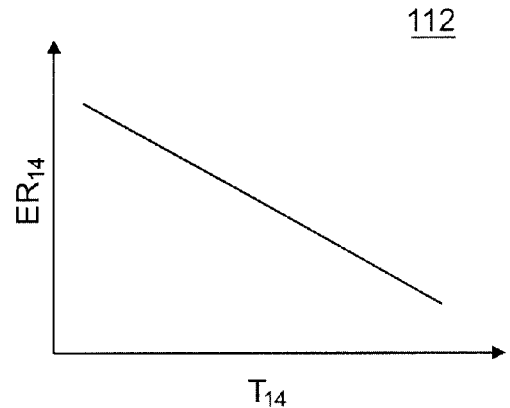

FIG. 7B illustrates the relationship between the film formation temperature $T_{14}$ and an etching rate $ER_{14}$ of the inter-electrode insulating film 14. The film formation temperature $T_{14}$ is plotted on the horizontal axis; and the etching rate $ER_{14}$ is plotted on the vertical axis.

Figure 7C:
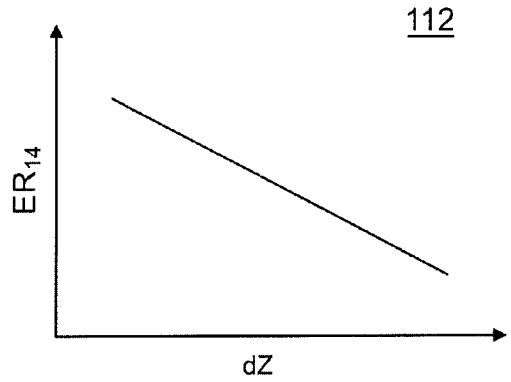

FIG. 7C illustrates the relationship between the etching rate $ER_{14}$ of the inter-electrode insulating film 14 and the distance dZ from the substrate 11. The distance dZ from the substrate 11 is plotted on the horizontal axis; and the etching rate $ER_{14}$ is plotted on the vertical axis.

Figure 7D:
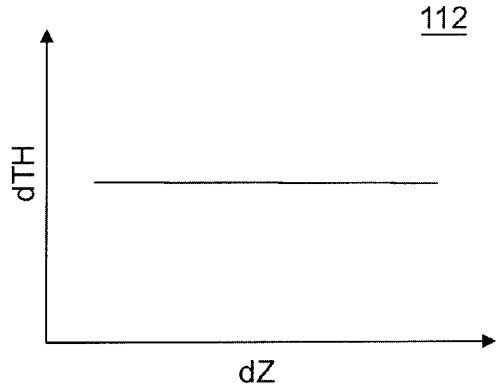

FIG. 7D illustrates the relationship between the diameter dTH of the through-hole TH and the distance dZ from the substrate 11.

Figure 7E:
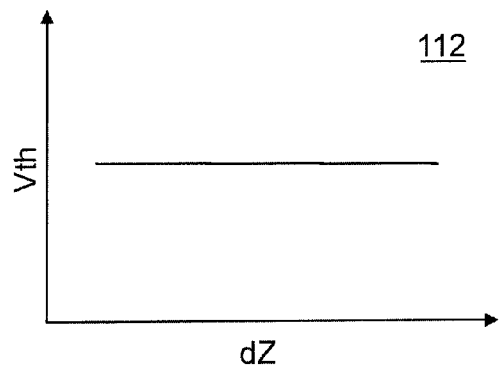

FIG. 7E illustrates the relationship between the threshold voltage Vth of the memory cell MC and the distance dZ from the substrate 11.

As illustrated in FIG. 7A, the film formation temperature $T_{14}$ of the inter-electrode insulating film 14 is increased as the distance dZ from the substrate 11 increases.

As illustrated in FIG. 7B, the etching rate $ER_{14}$ of the inter-electrode insulating film 14 decreases as the film formation temperature $T_{14}$ of the inter-electrode insulating film 14 increases.

Accordingly, as illustrated in FIG. 7C, the etching rate $ER_{14}$ of the inter-electrode insulating film 14 decreases as the distance dZ from the substrate 11 increases.

As a result, as illustrated in FIG. 7D, the diameter dTH of the through-hole TH is constant regardless of the distance dZ from the substrate 11.

Thereby, as illustrated in FIG. 7E, the threshold voltage Vth of the memory cell MC is constant regardless of the distance dZ from the substrate 11.

FIGS. 8A to 8D are schematic cross-sectional views in order of the processes, illustrating a method for manufacturing the nonvolatile semiconductor memory device according to the second embodiment.

Figures 8A, 8B:
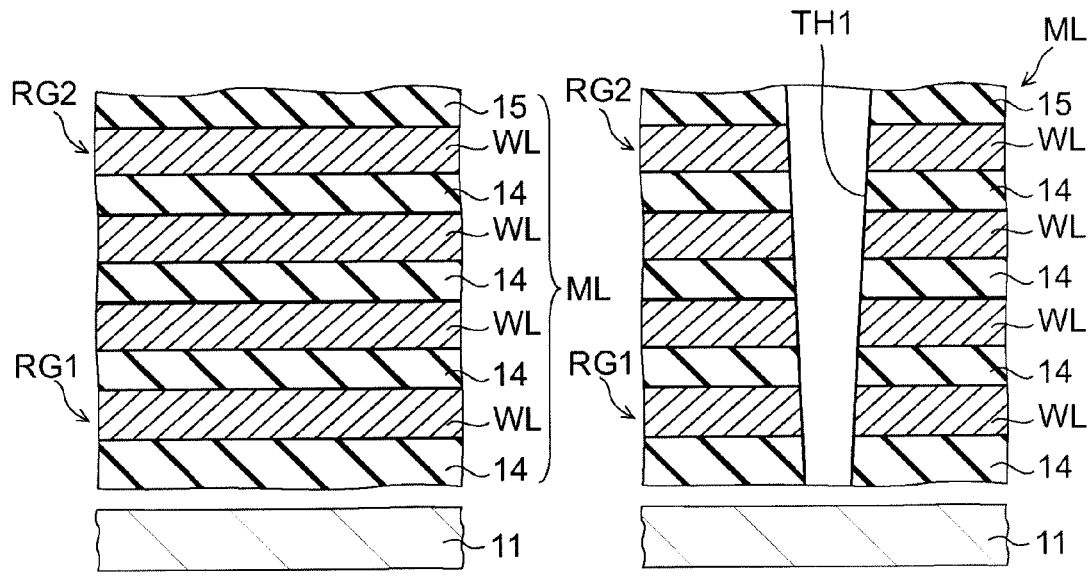
FIGS. 8A to 8D are schematic cross-sectional views in order of the processes, illustrating a method for manufacturing the nonvolatile semiconductor memory device according to the second embodiment.

First, as illustrated in FIG. 8A, the stacked structural body ML (also including the inter-layer insulating film 15) in which the electrode films WL are stacked alternately with the inter-electrode insulating films 14 is formed on the substrate 11. At this time, for example, the concentration of the additive of the electrode film WL is constant in the Z axis direction.

On the other hand, the film formation temperature of the inter-electrode insulating film 14 is changed in the Z axis direction.

For example, in the case where the silicon oxide film forming the inter-electrode insulating film 14 is formed by atmospheric pressure CVD using TEOS/$O_3$, the film formation temperature $T_{14}$ is set to 400° C. in the first region RG1 proximal to the substrate 11; and the film formation temperature $T_{14}$ is set to 550° C. in the second region RG2 distal to the substrate 11. Between the first region RG1 and the second region RG2, the film formation temperature $T_{14}$ has values between 400° C. and 550° C. and is set to increase from the first region RG1 toward the second region RG2.

Thus, by changing the film formation temperature $T_{14}$ of the inter-electrode insulating film 14 between the first region RG1 and the second region RG2, for example, the density of the inter-electrode insulating film 14 changes. In other words, films formed at low temperatures are more porous than films formed at high temperatures. Thereby, the etching rate $ER_{14}$ increases.

As illustrated in FIG. 8B, a hard mask layer is provided on such a stacked structural body ML; and the hole TH1 forming the through-hole TH is made by lithography and RIE.

At this time, the diameter of the lower portion (the first region RG1) is smaller than the diameter of the upper portion (the second region RG2); and the hole TH1 has a tapered configuration.

Figures 8C, 8D:
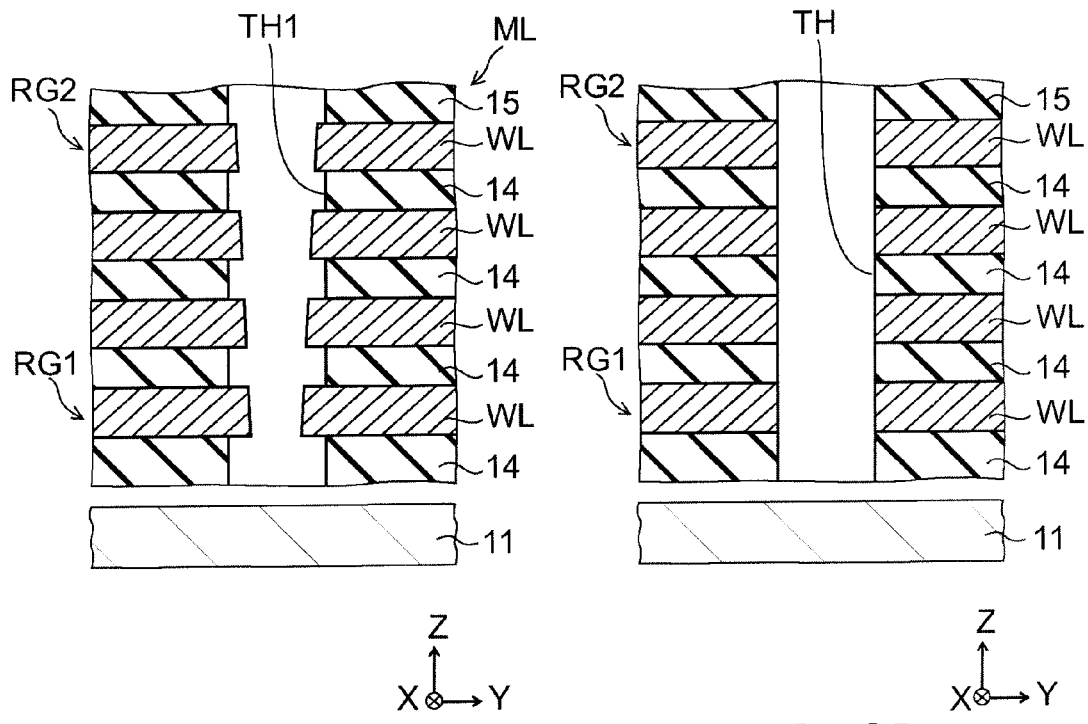

In such a case, as illustrated in FIG. 8C, the inter-electrode insulating film 14 is selectively etched isotropically.

In other words, processing is performed using, for example, diluted hydrofluoric acid. In such etching as illustrated in FIG. 7B, the etching rate $ER_{14}$ is fast in the lower portion (the first region RG1) where the film formation temperature $T_{14}$ is low; and the etching rate $ER_{14}$ is slow in the upper portion (the second region RG2) where the film formation temperature $T_{14}$ is high.

Therefore, as illustrated in FIG. 8C, the spacing (the diameter of the hole TH1) between the inter-electrode insulating films 14 in the first region RG1 is enlarged relatively more than in the second region RG2. In other words, the portions of the hole TH1 made in the tapered configuration opposing the inter-electrode insulating films 14 are etched; and the etching amount in the lower portion (the first region RG1) is greater than in the upper portion (the second region RG2). Thereby, the spacing (the hole TH1) between the inter-electrode insulating films 14 can be substantially the same between the lower portion and the upper portion.

Because the inter-electrode insulating films 14 are recessed by the etching, the electrode films WL protrude from the inter-electrode insulating films 14 inside the hole TH1.

Subsequently, as illustrated in FIG. 8D, the electrode films WL protruding inside the hole TH1, for example, are etched and pulled back by processing using a mixed liquid of aqueous $NH_3+H_2O_2$, alkaline hydrogen peroxide treatment using a cholinergic solution, hot phosphoric acid treatment, dry processing such as RIE capable of etching in the lateral direction; and the protruding portions recited above are removed. Thereby, the through-hole TH is completed. Such a through-hole has substantially the same diameter between the first region RG1 and the second region RG2; and the wall face of the through-hole TH is substantially perpendicular with respect to the Z axis.

Thereafter, the nonvolatile semiconductor memory device 112 is constructed by the prescribed processes. In the nonvolatile semiconductor memory device 112 as well, the through-hole TH can be made with a perpendicular wall; the threshold voltage characteristics can be uniform between the upper portion and the lower portion; and stable operations can be realized.

Although the etching rate $ER_{14}$ of the inter-electrode insulating film 14 is controlled by controlling the film formation temperature $T_{14}$ of the inter-electrode insulating film 14 in the description recited above, the invention is not limited thereto. For example, the conditions of the source material of the inter-electrode insulating film 14 may be changed. For example, the etching rate of the inter-electrode insulating film 14 also can be controlled by changing the proportion of TEOS and $O_3$.

One other nonvolatile semiconductor memory device 112a (not illustrated) according to the second embodiment of the invention will now be described.

In the nonvolatile semiconductor memory device 112a, a combination of the electrode film WL described in regard to the nonvolatile semiconductor memory device 110 and the inter-electrode insulating film 14 described in regard to the nonvolatile semiconductor memory device 112 is applied. In other words, the additive included in the electrode film WL includes P and Ge; the concentration of Ge is changed between the first region RG1 and the second region RG2; and the etching rate $ER_{WL}$ of the electrode film WL is changed between the first region RG1 and the second region RG2. Further, the film formation temperature $T_{14}$ of the inter-electrode insulating film 14 is changed between the first region RG1 and the second region RG2; and the etching rate $ER_{14}$ of the inter-electrode insulating film 14 is changed between the first region RG1 and the second region RG2.

Figures 9A, 9B:
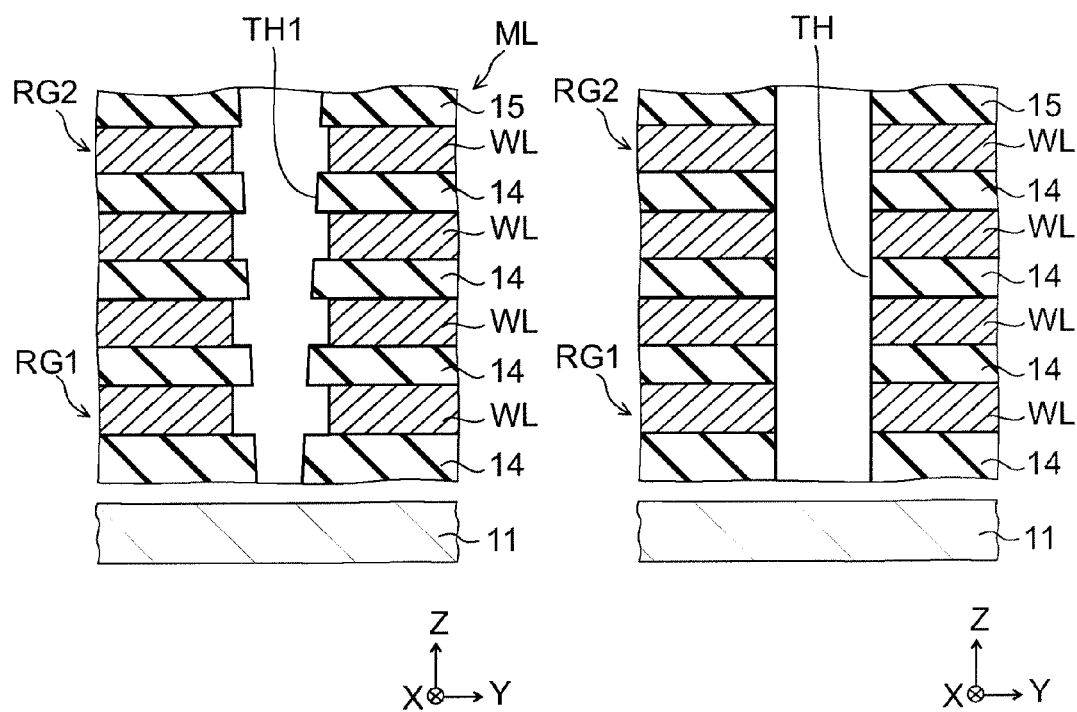
FIGS. 9A and 9B are schematic cross-sectional views in order of the processes, illustrating a method for manufacturing one other nonvolatile semiconductor memory device according to the second embodiment.

FIGS. 9A and 9B are schematic cross-sectional views in order of the processes, illustrating a method for manufacturing the one other nonvolatile semiconductor memory device according to the second embodiment.

First, the stacked structural body ML (including the interlayer insulating film 15), in which the electrode films WL are stacked alternately with the inter-electrode insulating films 14, is formed on the substrate 11.

For example, in the first region RG1 proximal to the substrate 11, the concentration $C_{Ge}$ of Ge is 20%; and the concentration $C_{Ge}$ of Ge in the second region RG2 distal to the substrate 11 is 0%. Between the first region RG1 and the second region RG2, the concentration $C_{Ge}$ of Ge is set to decrease from the first region RG1 toward the second region RG2. The concentration of P of the electrode film WL is constant regardless of the distance dZ from the substrate 11.

Thus, the etching rate $ER_{WL}$ of the electrode film WL is changed between the first region RG1 and the second region RG2 by changing the concentration $C_{Ge}$ of Ge of the electrode film WL.

On the other hand, the silicon oxide film forming the inter-electrode insulating film 14 is formed by, for example, atmospheric pressure CVD using $TEOS/O_3$. The film formation temperature $T_{14}$ is set to 400° C. in the first region RG1 proximal to the substrate 11; and the film formation temperature $T_{14}$ is set to 550° C. in the second region RG2 distal to the substrate 11. Between the first region RG1 and the second region RG2, the film formation temperature $T_{14}$ is set to increase from the first region RG1 toward the second region RG2. Thus, the etching rate $ER_{14}$ of the inter-electrode insulating film 14 is changed between the first region RG1 and the second region RG2 by changing the film formation temperature $T_{14}$ of the inter-electrode insulating film 14.

Subsequently, a hard mask layer is provided on the stacked structural body ML; and the hole TH1 forming the through-hole TH is made by lithography and RIE.

Then, subsequently as illustrated in FIG. 9A, the spacing (the diameter of the hole TH1) between the electrode films WL in the first region RG1 are enlarged relatively more than in the second region RG2 by selectively etching the electrode films WL isotropically by processing using, for example, a mixed liquid of aqueous $NH_3+H_2O_2$. In other words, the portions of the hole TH1 made in the tapered configuration opposing the electrode films WL are etched; and the etching amount is greater in the lower portion (the first region RG1) than in the upper portion (the second region RG2). Thereby, the spacing (the hole TH1) between the electrode films WL can be substantially the same between the lower portion and the upper portion.

Subsequently, as illustrated in FIG. 9B, the spacing (the diameter of the hole TH1) between the inter-electrode insulating films 14 in the first region RG1 is enlarged relatively more than in the second region RG2 by selectively etching the inter-electrode insulating films 14 isotropically by processing using, for example, diluted hydrofluoric acid. In other words, the portions of the hole TH1 made in the tapered configuration opposing the inter-electrode insulating films 14 are etched; and the etching amount is greater in the lower portion (the first region RG1) than in the upper portion (the second region RG2). Thereby, the spacing (the hole TH1) between the inter-electrode insulating films 14 can be substantially the same between the lower portion and the upper portion.

Thus, the diameter of the through-hole TH can be the same between the first region RG1 and the second region RG2 at the portions of the through-hole TH opposing the electrode films WL and the portions of the through-hole TH opposing the inter-electrode insulating films 14.

While the etching rate $ER_{14}$ of the inter-electrode insulating film 14 is controlled to provide a uniform diameter of the through-hole TH in the nonvolatile semiconductor memory device 112 described above, in the nonvolatile semiconductor memory device 112a of this specific example, a uniform diameter of the through-hole TH is provided by controlling the etching rate $ER_{14}$ of the inter-electrode insulating film 14 while controlling the etching rate $ER_{WL}$ of the electrode film WL.

Thus, the nonvolatile semiconductor memory device 112a includes: the substrate 11; the stacked structural body ML provided on the major surface 11a of the substrate 11, where the stacked structural body ML includes the multiple electrode films WL stacked alternately with the multiple inter-electrode insulating films 14 in the first direction (the Z axis direction) perpendicular to the major surface 11a; the semiconductor pillar SP piercing the stacked structural body ML in the first direction; and the memory unit (the memory layer 48) provided at the intersection between the semiconductor pillar SP and each of the electrode films WL. The stacked structural body ML includes the first region RG1 and the second region RG2 having a distance to the substrate 11 greater than the distance from the first region RG1 to the substrate 11; and the etching rate of at least one selected from the electrode film WL and the inter-electrode insulating film 14 in the first region RG1 is set higher than the etching rate of the at least one selected from the electrode film WL and the inter-electrode insulating film 14 in the second region RG2.

Third Embodiment

In a nonvolatile semiconductor memory device according to a third embodiment of the invention, the threshold voltage Vth of the memory cell MC is uniform even in the case where the diameter of the through-hole TH is nonuniform.

Figure 10:
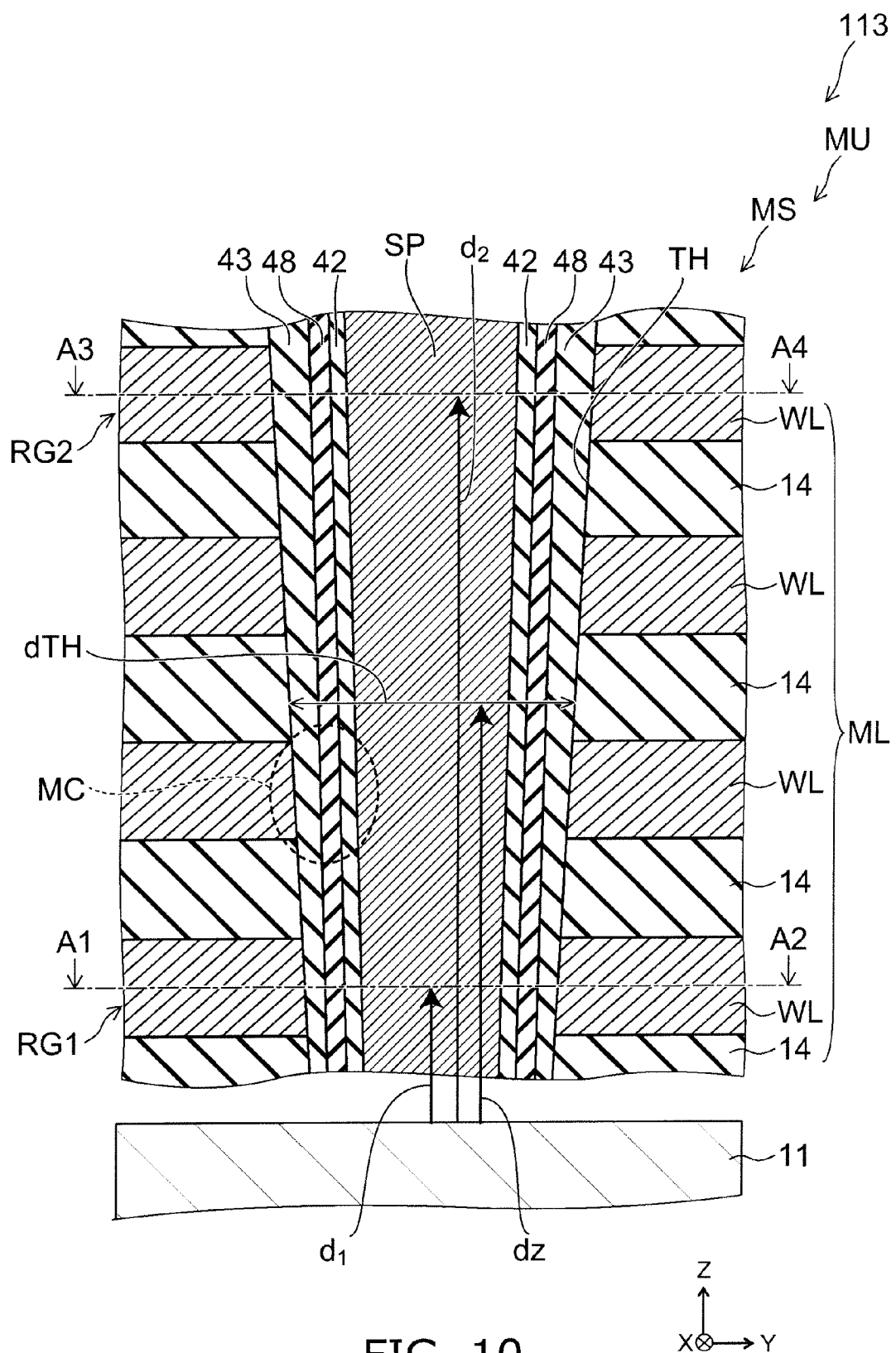
FIG. 10 is a schematic cross-sectional view illustrating the configuration of a nonvolatile semiconductor memory device according to a third embodiment.

FIG. 10 is a schematic cross-sectional view illustrating the configuration of the nonvolatile semiconductor memory device according to the third embodiment.

In a nonvolatile semiconductor memory device 113 according to this embodiment as illustrated in FIG. 10, the diameter of the through-hole TH is nonuniform in the Z axis direction.

For example, the through-hole TH has a tapered configuration.

In other words, in this specific example, the diameter of the through-hole TH in the first region RG1 (i.e., the outer diameter of the outer insulating film 43 when the outer insulating film 43 is cut along line A1-A2) is smaller than the diameter of the through-hole TH in the second region RG2 (i.e., the outer diameter of the outer insulating film 43 when the outer insulating film 43 is cut along line A3-A4).

In such a case where the diameter of the through-hole TH differs, the concentration of the additive added to the electrode film WL may be controlled so that the threshold voltage of the memory cell MC is uniform. Otherwise, the device is similar to the nonvolatile semiconductor memory device 110, and a description is therefore omitted.

In addition to the threshold voltage Vth of the memory cell MC depending on the difference of the electric fields between the inner insulating film 42 and the outer insulating film 43 based on the diameter of the through-hole TH as described above, the threshold voltage Vth of the memory cell MC also depends on the dielectric constant, work function, etc., of the materials used in the semiconductor pillar SP, the inner insulating film 42, the memory layer 48, the outer insulating film 43, and the electrode film WL.

In the nonvolatile semiconductor memory device 113, the work function of the electrode film WL, for example, is changed by changing the concentration of the additive included in the electrode film WL. Thereby, the threshold voltage Vth of the memory cell MC changes. In such a case, for example, the concentration of the additive included in the electrode film WL may be controlled to compensate the fluctuation of the threshold voltage Vth of the memory cell MC due to the fluctuation of the diameter of the through-hole TH.

Figure 11:
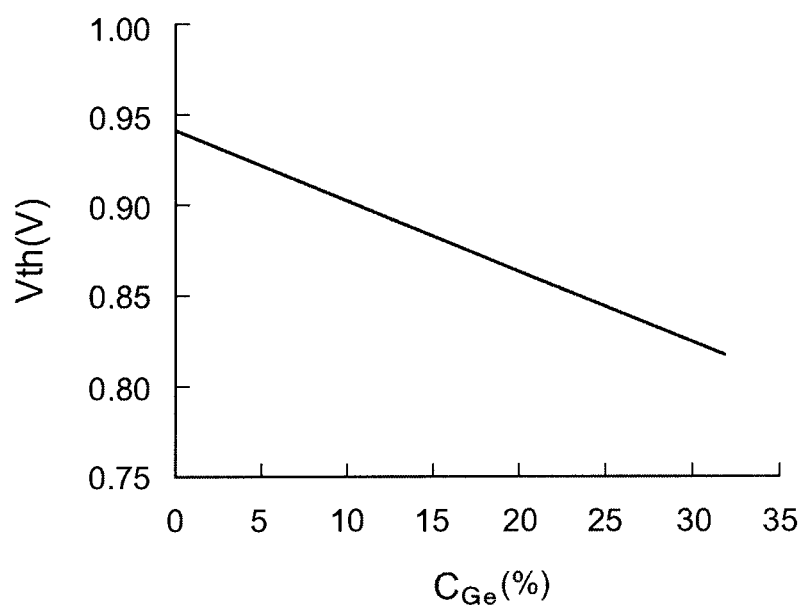
FIG. 11 is a graph illustrating a characteristic of the nonvolatile semiconductor memory device according to the third embodiment.

FIG. 11 is a graph illustrating a characteristic of the nonvolatile semiconductor memory device according to the third embodiment.

Namely, FIG. 11 illustrates the relationship between the concentration of Ge and the threshold voltage Vth in the case where Ge is added to a polysilicon gate containing B of a P-type MOS transistor. In other words, FIG. 11 illustrates the change of the threshold voltage Vth of the memory cell MC when the added amount of B is constant and the concentration of Ge is changed in the case where polysilicon having B and Ge added thereto is used as the electrode film WL of the nonvolatile semiconductor memory device 113. In FIG. 11, the concentration $C_{Ge}$ of Ge is plotted on the horizontal axis; and the threshold voltage Vth is plotted on the vertical axis. Here, the concentration $C_{Ge}$ of Ge is in atomic percent.

As illustrated in FIG. 11, the threshold voltage Vth decreases about 0.2 V (volts) as the concentration $C_{Ge}$ of Ge increases from 0% to 30%. The characteristic illustrated in FIG. 11 is one example. The change rate of the threshold voltage Vth with respect to the change of the concentration $C_{Ge}$ of Ge depends also on the film formation conditions of the polysilicon film and on the added amount of B. For example, the threshold voltage Vth decreases about 0.1 V to 0.3 V as the concentration $C_{Ge}$ of Ge is increased from 0% to 30%.

For example, in the case where the concentration $C_{Ge}$ of Ge in the electrode film WL is constant and the through-hole TH has a tapered configuration in which the diameter of the through-hole TH in the first region RG1 (the lower portion) is smaller in the second region RG2 (the upper portion), the difference of the electric fields between the inner insulating film 42 and the outer insulating film 43 is greater in the lower portion than in the upper portion. Therefore, the threshold voltage Vth in the lower portion is a characteristic which is lower than in the upper portion.

In such a case, the concentration of the additive (in this case, the concentration $C_{Ge}$ of Ge) included in the electrode film WL is controlled to compensate this characteristic. In other words, by making the concentration $C_{Ge}$ of Ge in the lower portion lower than in the upper portion, the change of the threshold voltage Vth due to the change of the concentration of the additive is a characteristic in which the threshold voltage Vth in the lower portion is higher than in the upper portion.

As a result, the fluctuation of the threshold voltage Vth of the memory cell MC due to the fluctuation of the diameter of the through-hole TH is compensated by controlling the concentration of the impurity of the electrode film WL; and the threshold voltage Vth can be substantially equal between the first region RG1 and the second region RG2.

Thus, in the nonvolatile semiconductor memory device 113, the concentration of the additive in the first region RG1 is different from the concentration of the additive in the second region RG2; and the fluctuation of the threshold voltage Vth caused by the difference of the curvatures between the inner insulating film 42 and the outer insulating film 43 based on the difference of the diameter of the through-hole TH is compensated. Therefore, the threshold voltage characteristic can be uniform between the first region RG1 (the upper portion) and the second region RG2 (the lower portion); and stable operations can be realized.

Although examples are illustrated in the specific examples recited above in which the concentration $C_{Ge}$ of Ge is controlled in the polysilicon in which B is added, the concentration $C_{Ge}$ of Ge may be changed in polysilicon in which P is added; and instead of the concentration $C_{Ge}$ of Ge, the concentration of B or the concentration of P may be changed. Similar effects can be obtained also in the case where amorphous silicon is used instead of polysilicon.

However, the configuration in which the concentration $C_{Ge}$ of Ge is controlled in the polysilicon in which B is added is more advantageous because the work function can be greatly changed while suppressing the fluctuation of the gate depletion of the electrode film WL; and therefore, it is easy to control the threshold voltage Vth in the desired state (the uniform state) while maintaining other high characteristics.

Fourth Embodiment

Figure 12:
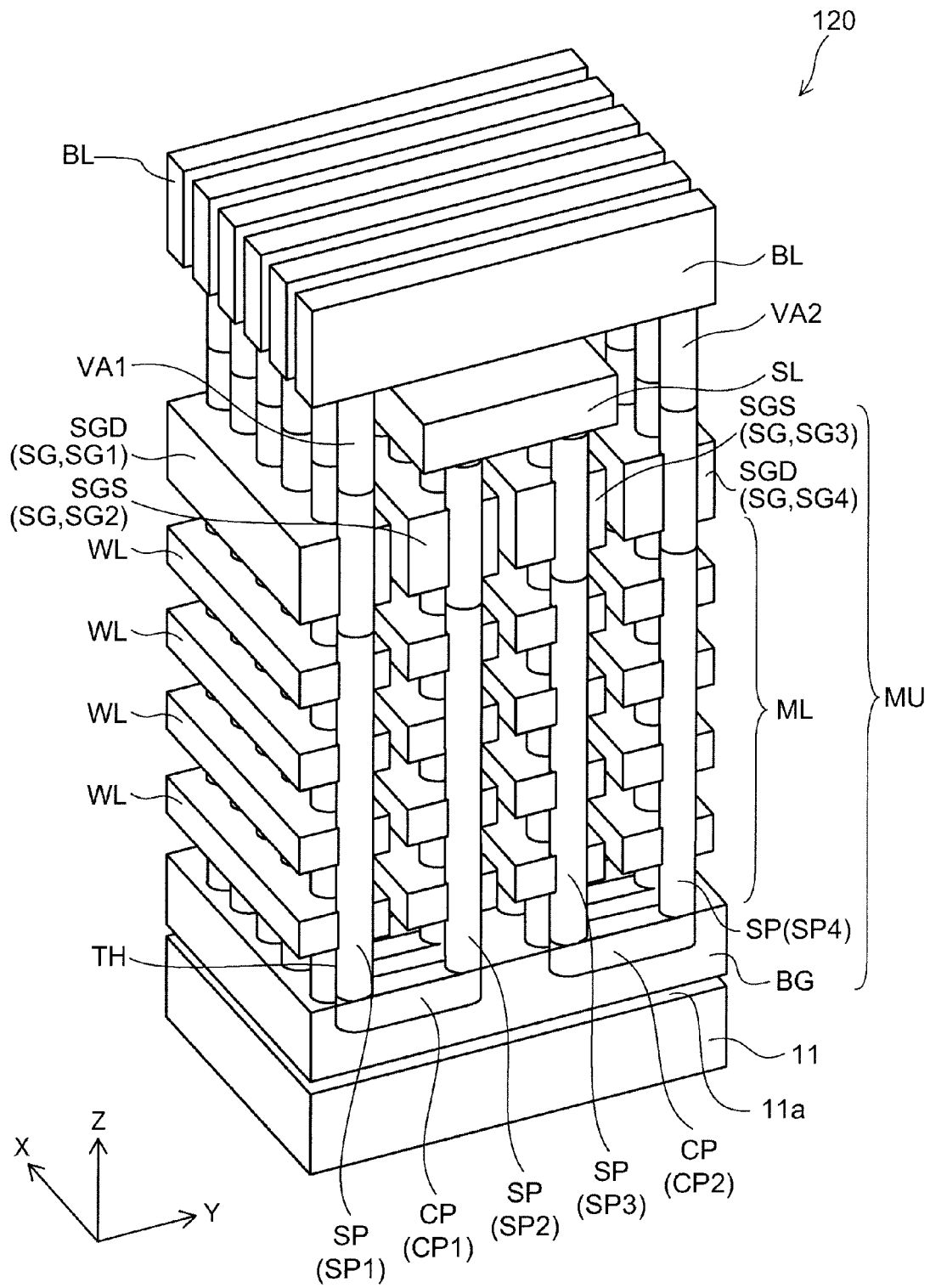
FIG. 12 is a schematic perspective view illustrating the configuration of a nonvolatile semiconductor memory device according to a fourth embodiment.

FIG. 12 is a schematic perspective view illustrating the configuration of a nonvolatile semiconductor memory device according to a fourth embodiment.

For easier viewing of the drawing in FIG. 12, only the conductive portions are illustrated, and the insulating portions are not illustrated.

In the nonvolatile semiconductor memory device 120 as illustrated in FIG. 12, two semiconductor pillars SP are connected by a connection portion CP.

In other words, the nonvolatile semiconductor memory device 120 includes: the stacked structural body ML provided on the major surface 11a of the substrate 11, where the stacked structural body ML includes the multiple electrode films WL stacked alternately with the multiple inter-electrode insulating films 14 in the Z axis direction; a first semiconductor pillar SP1 piercing the stacked structural body ML in the Z axis direction; the memory layer 48 (the memory unit); the inner insulating film 42; and the outer insulating film 43. The first semiconductor pillar SP1 is one of the semiconductor pillars SP described above.

In this specific example, the electrode film WL is divided, for example, in the Y axis direction; and the electrode film WL is aligned in the X axis direction.

The nonvolatile semiconductor memory device 120 further includes a second semiconductor pillar SP2 and a first connection portion CP1 (the connection portion CP). The second semiconductor pillar SP2 is one of the semiconductor pillars SP described above.

The second semiconductor pillar SP2 is, for example, adjacent to the first semiconductor pillar SP1 in the Y axis direction and pierces the stacked structural body ML in the Z axis direction.

The memory layer 48 is provided also between the second semiconductor pillar SP2 and each of the electrode films WL. The inner insulating film 42 is provided also between the second semiconductor pillar SP2 and the memory layer 48. The outer insulating film 43 is provided also between the memory layer 48 of the second semiconductor pillar SP2 and the electrode films WL.

The first connection portion CP1 electrically connects the first semiconductor pillar SP1 to the second semiconductor pillar SP2 on the same side in the Z axis direction (the substrate 11 side). The first connection portion CP1 is provided to align in the Y axis direction. The material used in the first connection portion CP1 may be the same as that of the first and second semiconductor pillars SP1 and SP2.

A back gate BG (a connection portion conductive layer) is provided, for example, on the major surface 11a of the substrate 11 via an inter-layer insulating film. A trench is made in the portion of the back gate BG opposing the first and second semiconductor pillars SP1 and SP2; and the film forming each of the outer insulating film 43, the memory layer 48, and the inner insulating film 42 are formed in the interior of the trench; and the connection portion CP made of a semiconductor is filled into the remaining space thereof. The forming of the films forming the outer insulating film 43, the memory layer 48, the inner insulating film 42, and the connection portion CP in the trench can be performed collectively and simultaneously with the forming of the outer insulating film 43, the memory layer 48, the inner insulating film 42, and the semiconductor pillar SP in the through-hole TH. Thus, the back gate BG is provided to oppose the connection portion CP.

Thereby, the first and second semiconductor pillars SP1 and SP2 and the connection portion CP form a semiconductor pillar having a U-shaped configuration which forms a NAND string having a U-shaped configuration.

As illustrated in FIG. 12, the end of the first semiconductor pillar SP1 opposite to the first connection portion CP1 is connected to the bit line BL; and the end of the second semiconductor pillar SP2 opposite to the first connection portion CP1 is connected to the source line SL. The semiconductor pillars SP and the bit lines BL are connected by a via VA1 and a via VA2.

In this specific example, the bit line BL is aligned in the Y axis direction; and the source line SL is aligned in the X axis direction.

Between the bit lines BL and the stacked structural body ML, the drain-side selection gate electrode SGD (a first selection gate electrode SG1) is provided to oppose the first semiconductor pillars SP1; and the source-side selection gate electrode SGS (a second selection gate electrode SG2) is provided to oppose the second semiconductor pillars SP2. Thereby, the desired data can be written to or read from any memory cell MC of any semiconductor pillar SP. The drain-side selection gate electrode SGD and the source-side selection gate electrode SGS are included in the selection gate electrode SG.

The selection gate electrode SG may include any conductive material. For example, polysilicon or amorphous silicon may be used. In this specific example, the selection gate electrode SG has a band configuration divided in the Y axis direction and aligned along the X axis direction.

Thus, the selection gate electrode SG is provided above the stacked structural body ML (on the side most distal to the substrate 11); a through-hole is provided in the selection gate electrode SG; a selection gate insulating film of a selection gate transistor is provided on the inner side face thereof; and a semiconductor is filled thereinto. The semiconductor may be included in the semiconductor pillar SP.

The source line SL is provided above the selection gate electrode SG; and the bit line BL is provided above the source line SL. The bit line BL has a band configuration along the Y axis.

One X axis direction end of the electrode film WL is connected to a word interconnection by a via plug; and the other X axis direction end of the electrode film WL is electrically connected to, for example, a drive circuit provided in the substrate 11. In such a case, the X axis direction length of each of the electrode films WL stacked in the Z axis direction is changed to form a stairstep configuration; and the electrical connection between the drive circuit and the stacked electrode films WL is performed at the X axis direction ends.

As illustrated in FIG. 12, the nonvolatile semiconductor memory device 120 may further include a third semiconductor pillar SP3, a fourth semiconductor pillar SP4, and a second connection portion CP2. The third semiconductor pillar SP3 and the fourth semiconductor pillar SP4 are included in the semiconductor pillar SP; and the second connection portion CP2 is included in the connection portion CP.

The third semiconductor pillar SP3 is adjacent to the second semiconductor pillar SP2 in the Y axis direction on the side of the second semiconductor pillar SP2 opposite to the first semiconductor pillar SP1 to pierce the stacked structural body ML in the Z axis direction. The fourth semiconductor pillar SP4 is adjacent to the third semiconductor pillar SP3 in the Y axis direction on the side of the third semiconductor pillar SP3 opposite to the second semiconductor pillar SP2 to pierce the stacked structural body ML in the Z axis direction.

The second connection portion CP2 electrically connects the third semiconductor pillar SP3 to the fourth semiconductor pillar SP4 on the same Z axis direction side (the same side as the first connection portion CP1). The second connection portion CP2 is provided to align in the Y axis direction and oppose the back gate BG.

The memory layer 48 is provided also between the third and fourth semiconductor pillars SP3 and SP4 and each of the electrode films WL and between the back gate BG and the second connection portion CP2. The inner insulating film 42 is provided also between the memory layer 48 and the third and fourth semiconductor pillars SP3 and SP4 and between the memory layer 48 and the second connection portion CP2. The outer insulating film 43 is provided also between each of the electrode films WL and the memory layer 48 of the third and fourth semiconductor pillars SP3 and SP4 and between the back gate BG and the memory layer 48 of the second connection portion CP2.

The source line SL is connected to a third end portion of the third semiconductor pillar SP3 on the side opposite to the second connection portion CP2. The bit line BL is connected to a fourth end portion of the fourth semiconductor pillar SP4 on the side opposite to the second connection portion CP2.

The source-side selection gate electrode SGS (a third selection gate electrode SG3) is provided to oppose the third semiconductor pillar SP3; and the drain-side selection gate electrode SGD (a fourth selection gate electrode SG4) is provided to oppose the fourth semiconductor pillar SP4. The source-side selection gate electrode SGS and the drain-side selection gate electrode SGD are included in the selection gate electrode SG.

Also in the nonvolatile semiconductor memory device 120 having such a configuration, amorphous silicon or polysilicon may be used as the electrode film WL.

The concentration of the additive included in the electrode film WL in the first region RG1 is different from the concentration of the additive included in the electrode film WL in the second region RG2.

Thereby, the etching rate $ER_{WL}$ can be controlled between the upper portion and the lower portion; and the diameter of the through-hole TH can be the same between the upper portion and the lower portion. In other words, the through-hole TH can be made with a perpendicular wall; the threshold voltage characteristics can be uniform; and a nonvolatile semiconductor memory device having stable operations can be provided.

In the nonvolatile semiconductor memory device 120, a configuration may be employed in which the etching rate $ER_{14}$ of the inter-electrode insulating film 14 is controlled to make the diameter of the through-hole TH uniform by controlling the film formation temperature, the composition ratio of the source material, etc., of the inter-electrode insulating film 14.

Further, the diameter of the through-hole TH can be made uniform by controlling the etching rate $ER_{14}$ of the inter-electrode insulating film 14 while controlling the etching rate $ER_{WL}$ of the electrode film WL.

Moreover, in the nonvolatile semiconductor memory device 120, the threshold voltage characteristics between the first region RG1 (the upper portion) and the second region RG2 (the lower portion) can be uniform and stable operations can be realized by the concentration of the additive in the electrode film WL being different between the first region RG1 and the second region RG2 to compensate the fluctuation of the threshold voltage Vth caused by, for example, the difference of the curvatures between the inner insulating film 42 and the outer insulating film 43 based on the difference of the diameter of the through-hole TH.

Fifth Embodiment

A method for manufacturing a nonvolatile semiconductor memory device according to a fifth embodiment of the invention is a method for manufacturing a nonvolatile semiconductor memory device including: the substrate 11; the stacked structural body ML provided on the major surface 11a of the substrate 11, where the stacked structural body ML includes the multiple electrode films WL stacked alternately with the multiple inter-electrode insulating films 14 in the first direction (the Z axis direction) perpendicular to the major surface 11a; the semiconductor pillar SP piercing the stacked structural body ML in the first direction; and the memory unit (the memory layer 48) provided at the intersection between the semiconductor pillar SP and each of the electrode films WL. The distinctive portions of the manufacturing method will now be described.

Figure 13:
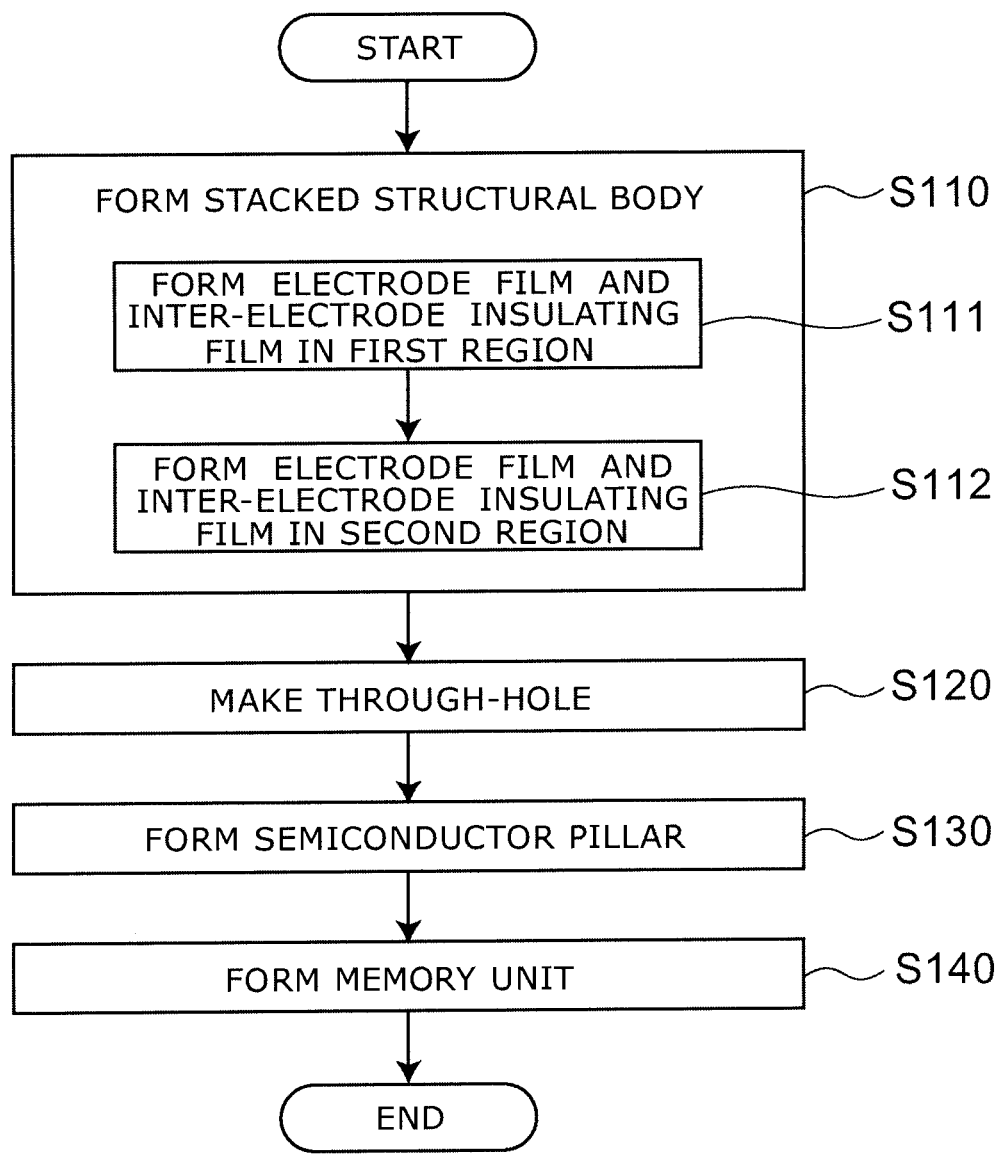
FIG. 13 is a flowchart illustrating a method for manufacturing a nonvolatile semiconductor memory device according to a fifth embodiment.

FIG. 13 is a flowchart illustrating the method for manufacturing the nonvolatile semiconductor memory device according to the fifth embodiment.

As illustrated in FIG. 13, the manufacturing method according to this embodiment includes: forming the stacked structural body ML on the major surface 11a of the substrate 11, where the stacked structural body ML includes the multiple electrode films WL stacked alternately with the multiple inter-electrode insulating films 14 (step S110); making the through-hole TH to pierce the stacked structural body ML in the first direction (the Z axis direction) (step S120); forming the semiconductor pillar SP by filling a semiconductor into the through-hole TH (step S130); and forming the memory unit (the memory layer 48) at the intersection between the semiconductor pillar SP and each of the electrode films WL (step S140).

The forming of the stacked structural body ML recited above (step S110) includes: forming at least one film selected from the electrode film WL and the inter-electrode insulating film 14 in the first region RG1 proximal to the substrate 11, where the etching rate of the at least one film in the first region RG1 in the making of the through-hole TH is fast (step S111); and forming the at least one film in the second region RG2 having a distance to the substrate 11 greater than the distance from the first region RG1 to the substrate 11, where the etching rate of the at least one film in the second region RG2 in the formation processing of the through-hole TH is slower than in the first region RG1 (step S112).

In other words, for example, the electrode film WL described in regard to FIG. 4A to FIG. 4C, the electrode film WL described in regard to FIG. 6A to FIG. 6C, the inter-electrode insulating film 14 described in regard to FIG. 7A to FIG. 7C, and the like are formed. Thereby, a through-hole can be made with a perpendicular wall such as, for example, the through-hole TH having a uniform diameter as described in regard to FIG. 5C and FIG. 5D, FIG. 8C and FIG. 8D, and FIG. 9A and FIG. 9B; the threshold voltage characteristics can be uniform between the upper portion and the lower portion; and a nonvolatile semiconductor memory device having stable operations can be manufactured.

Sixth Embodiment

A nonvolatile semiconductor memory device 160 (not illustrated) according to this embodiment also includes the substrate 11, the stacked structural body ML, the semiconductor pillar SP, and the memory unit (the memory layer 48). The configurations of the substrate 11, the semiconductor pillar SP, and the memory layer 48 may be similar to those of, for example, the nonvolatile semiconductor memory device 110 or the nonvolatile semiconductor memory device 120, and a description is therefore omitted.

In the nonvolatile semiconductor memory device 160 as well, the stacked structural body ML includes the multiple electrode films WL stacked alternately with the multiple inter-electrode insulating films 14 in the Z axis direction. The electrode film WL includes at least one selected from amorphous silicon and polysilicon. The impurity included in the electrode film WL includes C (carbon). The concentration of the additive (carbon) included in the electrode film WL in the first region RG1 is different from the concentration of the additive (carbon) included in the electrode film WL in the second region RG2.

For example, the concentration of carbon included in the electrode film WL in the first region RG1 may be set lower than the concentration of carbon included in the electrode film WL in the second region RG2.

In the case where carbon is added to amorphous silicon, the oxidation rate is suppressed compared to the case where, for example, carbon is not added. Also, in the case where carbon is added to amorphous silicon, the characteristics regarding deformation due to heat and the characteristics regarding stress due to strain are different from those of the case where carbon is not added. Similarly, in the case where carbon is added to polysilicon, the oxidation rate is suppressed. Further, in the case where carbon is added to polysilicon, the characteristics regarding deformation due to heat and the characteristics regarding stress due to strain are changed.

In the manufacturing processes of nonvolatile semiconductor memory devices, the electrode film WL in the upper portion (the second region RG2) of the stacked structural body ML undergoes more intense exposure to oxidizing agents such as oxygen, water vapor, ozone, radical oxygen, etc., than the electrode film WL in the lower portion (the first region RG1). Thereby, there is a trend for the electrode film WL in the upper portion (the second region RG2) to easily oxidize and deform.

In such a case, the oxidation of the electrode film WL in the upper portion (the second region RG2) intensely exposed to the oxidizing agents in the manufacturing can be suppressed and the deformation of the electrode film WL can be suppressed by, for example, setting the concentration of carbon included in the electrode film WL in the second region RG2 higher than the concentration of carbon included in the electrode film WL in the first region RG1.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, embodiments of the invention are not limited to these specific examples. For example, one skilled in the art may appropriately select specific configurations of components included in nonvolatile semiconductor memory devices such as substrates, electrode films, insulating films, insulating layers, stacked structural bodies, memory layers, charge storage layers, semiconductor pillars, word lines, bit lines, source lines, memory cell transistors, selection gate transistors, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and the methods for manufacturing the same described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A nonvolatile semiconductor memory device, comprising:
   a substrate;
   a stacked structural body provided on a major surface of the substrate, the stacked structural body including a plurality of electrode films alternately stacked with a plurality of inter-electrode insulating films in a first direction perpendicular to the major surface;
   a semiconductor pillar piercing the stacked structural body in the first direction; and
   a memory unit provided at an intersection between the semiconductor pillar and each of the electrode films,
   the plurality of electrode films including at least one selected from amorphous silicon or polysilicon,
   the stacked structural body including a first region and a second region, a distance from the second region to the substrate being greater than a distance from the first region to the substrate,
   the electrode films including an additive including at least one selected from germanium or phosphorus, and
   a concentration of the additive included in the electrode film in the first region being higher than a concentration of the additive included in the electrode film in the second region.

2. The device according to claim 1, wherein
   the additive includes germanium, and
   a concentration of germanium included in the electrode film in the first region is higher than the concentration of germanium included in the electrode film in the second region.

3. The device according to claim 1, wherein
   the additive includes phosphorus, and
   a concentration of phosphorus included in the electrode film in the first region is higher than the concentration of phosphorus included in the electrode film in the second region.

4. The device according to claim 1, wherein
   a work function of the electrode film in the first region is different from a work function of the electrode film in the second region.

5. The device according to claim 1, further comprising:
   an inner insulating film provided between the memory unit and the semiconductor pillar, and
   an outer insulating film provided between the memory unit and the plurality of electrode films.

6. The device according to claim 5, wherein a curvature of the inner insulating film is higher than a curvature of the outer insulating film.

7. The device according to claim 1, wherein the inter-electrode insulating film includes a silicon oxide film.

8. The device according to claim 1, wherein the memory unit includes a silicon nitride film.

9. A nonvolatile semiconductor memory device, comprising:
   a substrate;
   a stacked structural body provided on a major surface of the substrate, the stacked structure body including a plurality of electrode films alternately stacked with a plurality of inter-electrode insulating films in a first direction perpendicular to the major surface;
   a semiconductor pillar piercing the stacked structural body in the first direction; and
   a memory unit provided at an intersection between the semiconductor pillar and each of the electrode films,
   the plurality of electrode films including at least one selected from amorphous silicon or polysilicon,
   the stacked structure body including a first region and a second region, a distance from the second region to the substrate being greater than a distance from the first region to the substrate,
   the electrode films including an additive including boron, and
   a concentration of the additive included in the electrode film in the first region being lower than a concentration of the additive included in the electrode film in the second region.

10. A nonvolatile semiconductor memory device, comprising:
    a substrate;
    a stacked structural body provided on a major surface of the substrate, the stacked structural body including a plurality of electrode films alternately stacked with a plurality of inter-electrode insulating films in a first direction perpendicular to the major surface;
    a semiconductor pillar piercing the stacked structural body in the first direction; and
    a memory unit provided at an intersection between the semiconductor pillar and each of the electrode films,
    the plurality of electrode films including at least one selected from amorphous silicon or polysilicon,
    the stacked structural body including a first region and a second region, a distance from the second region to the substrate being greater than a distance from the first region to the substrate,
    the electrode films including an additive including carbon, and
    a concentration of carbon included in the electrode film in the first region being lower than a concentration of carbon included in the electrode film in the second region.

* * * * *